United States Patent
Nishimura

(10) Patent No.: US 11,137,696 B2
(45) Date of Patent: Oct. 5, 2021

(54) LITHOGRAPHY APPARATUS AND METHOD OF MANUFACTURING ARTICLE

(71) Applicant: CANON KABUSHIKI KAISHA, Tokyo (JP)

(72) Inventor: Naosuke Nishimura, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/877,872

(22) Filed: May 19, 2020

(65) Prior Publication Data
US 2020/0379362 A1    Dec. 3, 2020

(30) Foreign Application Priority Data

May 28, 2019   (JP) .............................. JP2019-099732

(51) Int. Cl.
*G03F 9/00* (2006.01)
*G03F 7/20* (2006.01)

(52) U.S. Cl.
CPC ........ *G03F 9/7088* (2013.01); *G03F 7/70775* (2013.01)

(58) Field of Classification Search
CPC .................................................. G03F 9/7088
See application file for complete search history.

(56) References Cited

U.S. PATENT DOCUMENTS

| 5,499,099 A * | 3/1996 | Sato ..................... G03F 7/70425 250/548 |
| 10,283,392 B2 | 5/2019 | Takakuwa |
| 10,353,286 B2 | 7/2019 | Usui |

FOREIGN PATENT DOCUMENTS

| JP | H08316122 A | 11/1996 |
| JP | 2010074075 A | 4/2010 |
| JP | 2016076626 A | 5/2016 |
| JP | 2017097056 A | 6/2017 |

* cited by examiner

*Primary Examiner* — Steven Whitesell Gordon
(74) *Attorney, Agent, or Firm* — Rossi, Kimms & McDowell LLP

(57) ABSTRACT

The present invention provides a lithography apparatus for performing a process of transferring a pattern of an original to each of shot regions two-dimensionally arrayed on a substrate, including a stage that moves while holding one of the substrate and the original, a measurement unit configured to measure, when performing the process, a positional shift amount between a mark provided on the original and a mark provided in each of the shot regions, and a control unit configured to control the process for the shot region so that after the process is performed successively for a plurality of first shot regions included in a first row, the process is performed successively for a plurality of second shot regions included in a second row adjacent to the first row.

13 Claims, 18 Drawing Sheets

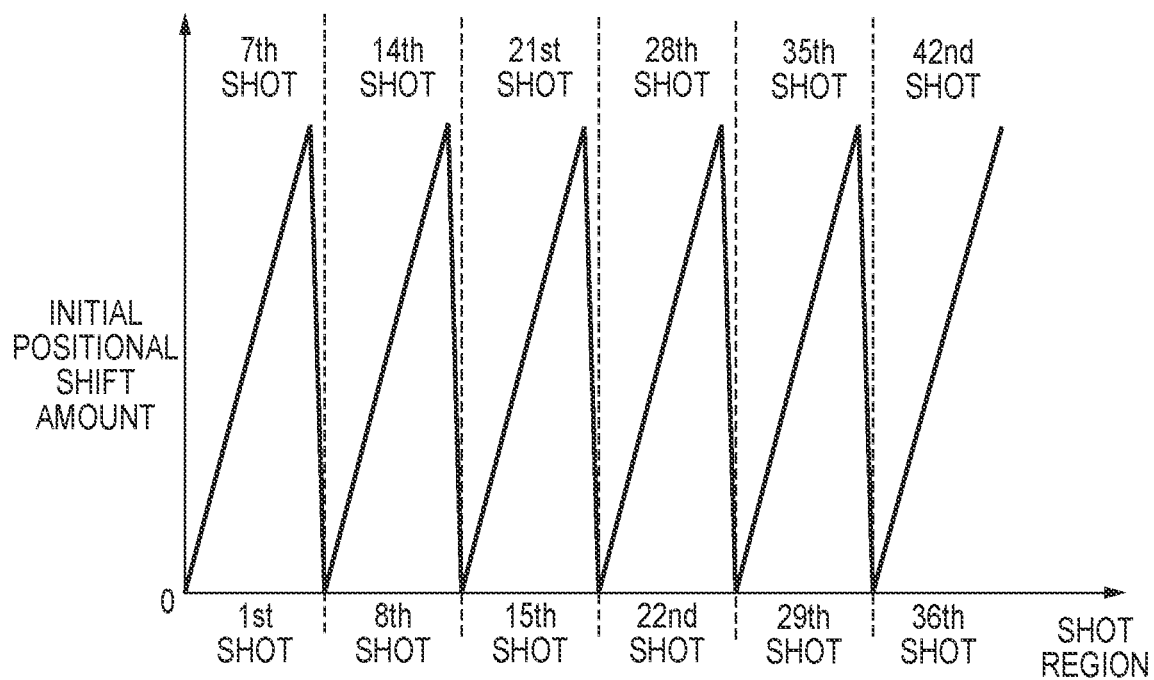

1st SUBSTRATE

2nd SUBSTRATE

3rd SUBSTRATE

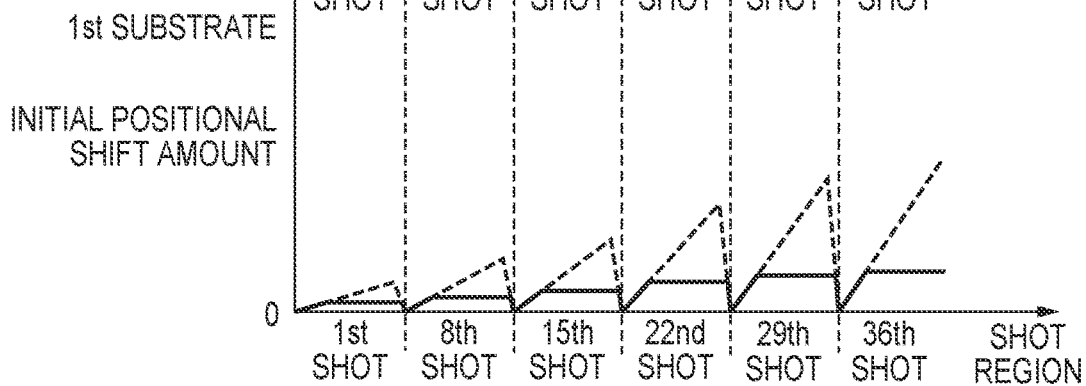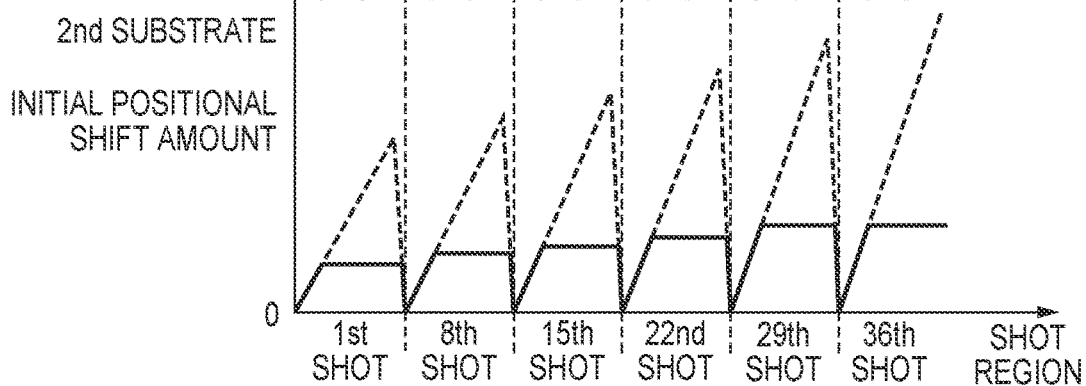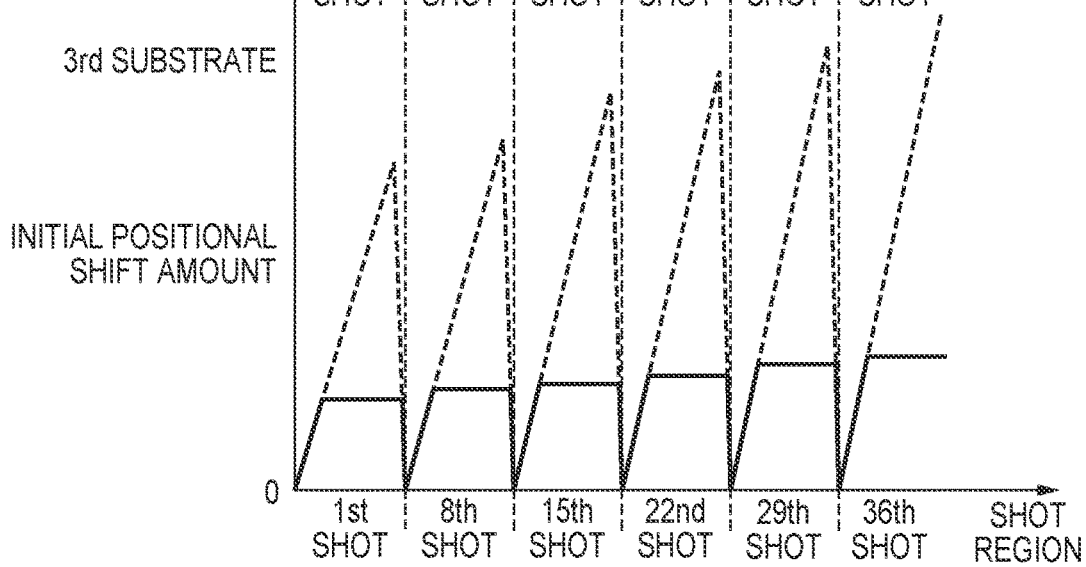

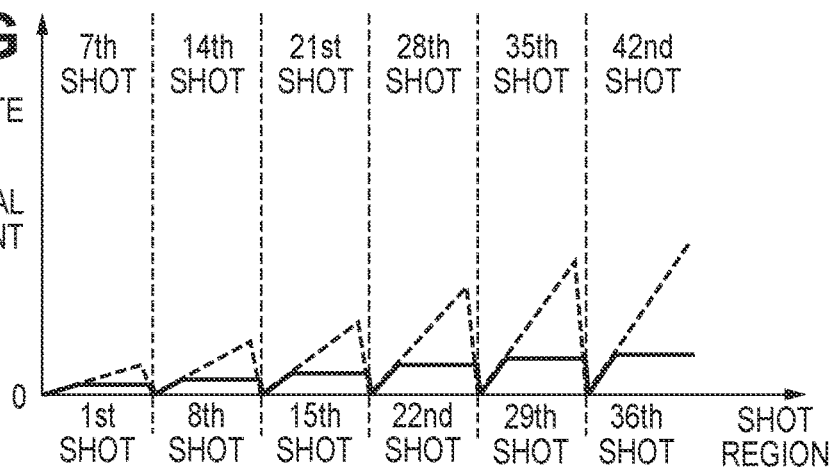
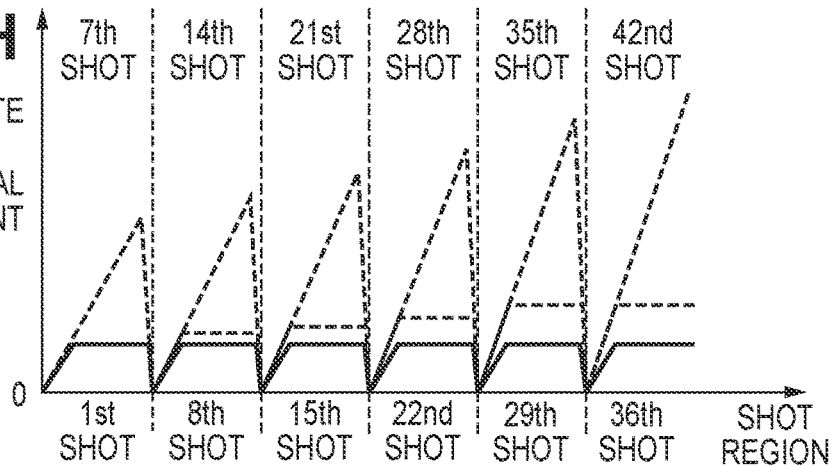
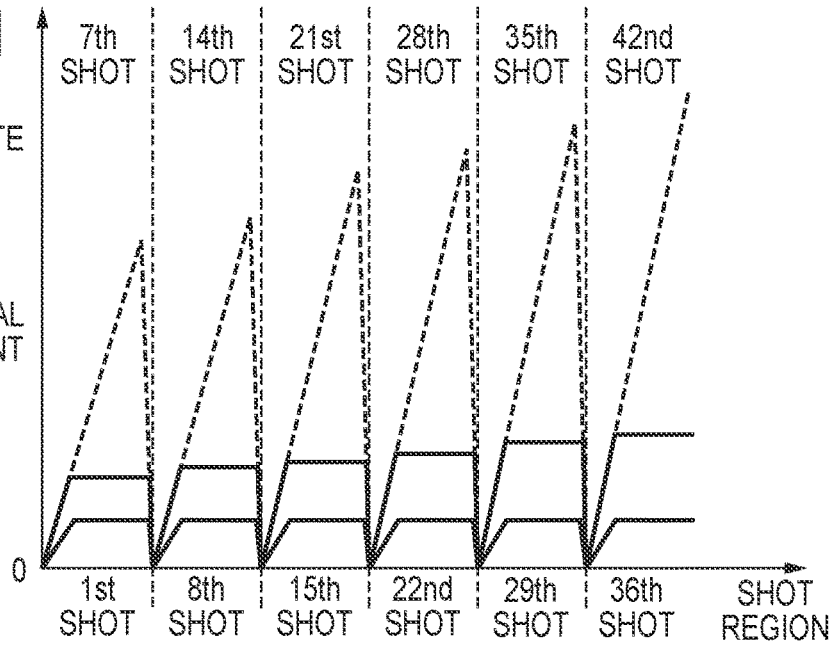

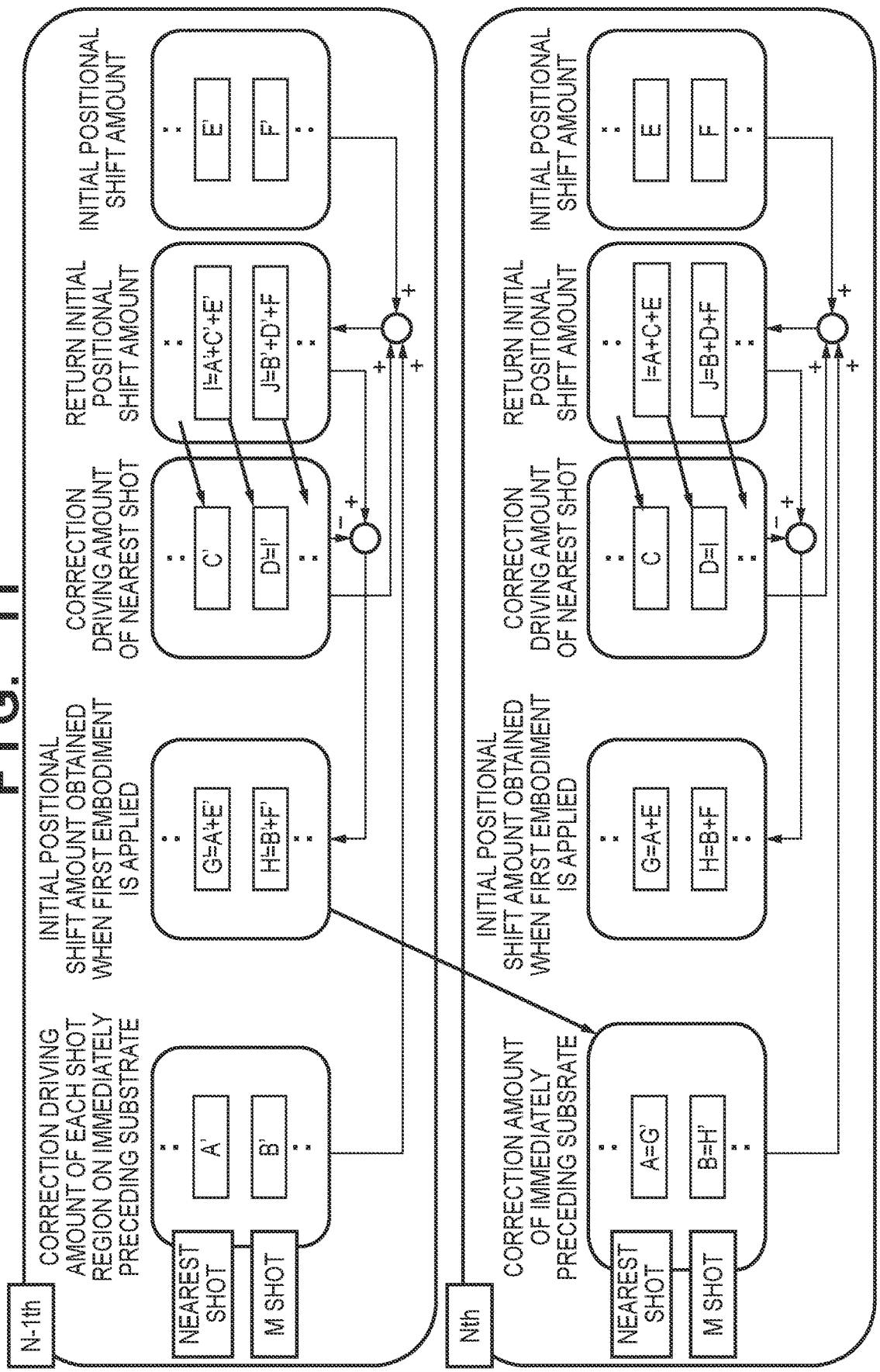

LITHOGRAPHY APPARATUS AND METHOD OF MANUFACTURING ARTICLE

BACKGROUND OF THE INVENTION

Field of the Invention

The present invention relates to a lithography apparatus and a method of manufacturing an article.

Description of the Related Art

As micropatterning of a semiconductor device advances, an imprint technique of bringing a mold into contact with an imprint material on a substrate and forming, on the substrate, a pattern of the imprint material corresponding to a fine pattern formed on the mold has been receiving attention as a microfabrication technique. An imprint apparatus using such imprint technique can form a several-nm fine pattern on the substrate.

The imprint apparatus includes, as steps of an imprint process, a supply step, a filling step, an alignment step, a curing step, and a release step. In the supply step, the imprint material is supplied (applied) onto the substrate. In the filling step, the pattern of the mold is filled with the imprint material by bringing the mold into contact with the imprint material on the substrate. In the alignment step, the mold and the substrate are aligned (positioned). In the curing step, the imprint material is cured in a state in which the mold is in contact with the imprint material on the substrate. In the release step, the mold is released from the cured imprint material on the substrate.

In the alignment step, the imprint apparatus measures a shift amount between a mark provided on the mold and a mark provided on the substrate for each shot region on the substrate in order to position the mark provided on the mold and the mark provided on the substrate. Then, by positioning the mold and the substrate so as to reduce the shift amount, it is possible to accurately align the mold and the substrate. A technique concerning the alignment step has been proposed in Japanese Patent Laid-Open No. 2016-76626.

In the imprint apparatus, to improve the speed of the imprint process, it is necessary to speed up a stage (obtain a higher speed or higher acceleration of the stage) that holds the substrate. If the stage is speeded up and driven continuously, the heat generation amount of the motor of the stage increases to deform a stage structure, thereby deforming a position measurement system (encoder or the like) of the stage provided in the stage structure. As a result, accuracy of position control (driving control) of the stage degrades, an initial shift amount between the mold (the mark provided thereon) and the substrate (the mark provided thereon) becomes large in the alignment step, and it thus takes a long time to position the mold and the substrate. If positioning between the mold and the substrate is not completed within a predetermined time, a pattern is formed in a state in which the position of the mold and that of the substrate shift from each other.

SUMMARY OF THE INVENTION

The present invention provides a lithography apparatus advantageous in alignment between an original and a substrate.

According to one aspect of the present invention, there is provided a lithography apparatus for performing a process of transferring a pattern of an original to each of shot regions two-dimensionally arrayed on a substrate, including a stage that moves while holding one of the substrate and the original, a measurement unit configured to measure, when performing the process, a positional shift amount between a mark provided on the original and a mark provided in each of the shot regions, and a control unit configured to control the process for the shot region so that after the process is performed successively for a plurality of first shot regions included in a first row, the process is performed successively for a plurality of second shot regions included in a second row adjacent to the first row, wherein when the process is performed for the initial second shot region among the plurality of second shot regions, the control unit corrects a target position of the stage when the process is performed for the initial second shot region, based on the positional shift amount measured by the measurement unit when the process is performed for the first shot region, among the plurality of first shot regions, whose distance from the initial second shot region is within a set distance.

Further features of the present invention will become apparent from the following description of exemplary embodiments with reference to the attached drawings.

BRIEF DESCRIPTION OF THE DRAWINGS

FIGS. 3A to 3C are views for explaining an error occurring in position measurement of a substrate stage when an X scale extends.

FIGS. 10A to 10I are views for explaining correction of the target position of the substrate stage according to the third embodiment.

FIG. 11 is a view schematically showing a correction order when the correction described in the second embodiment is performed after the correction described in the first embodiment is performed.

DESCRIPTION OF THE EMBODIMENTS

Figure 1A:
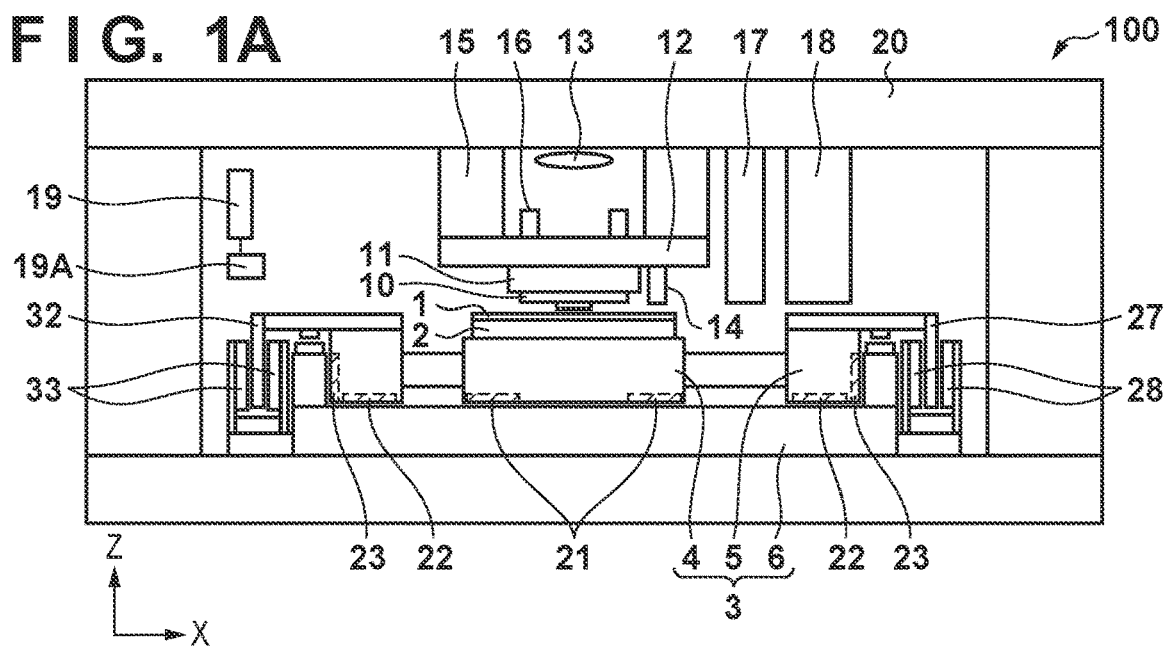
FIGS. 1A to 1C are schematic views each showing the arrangement of an imprint apparatus according to an aspect of the present invention.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

First Embodiment

Figure 1B:
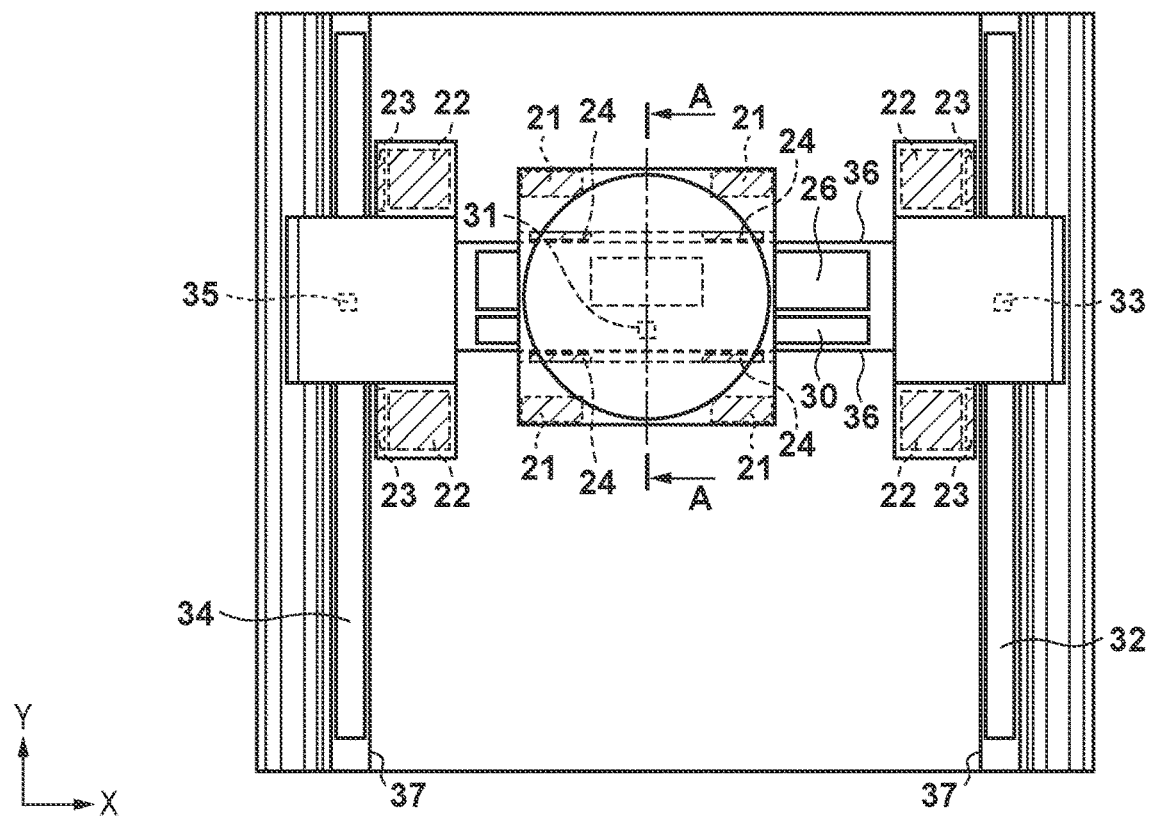
Figure 1C:
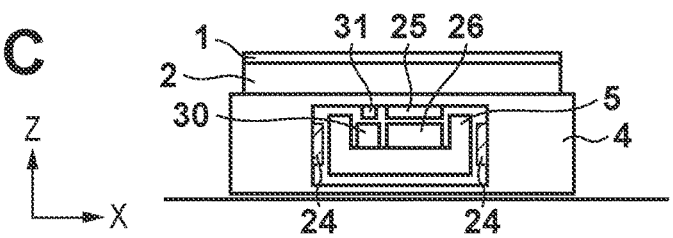

FIGS. 1A, 1B, and 1C are schematic views each showing the arrangement of an imprint apparatus 100 according to an aspect of the present invention. FIG. 1A is a front view of the imprint apparatus 100, FIG. 1B is a top view of the imprint apparatus 100, and FIG. 1C is a sectional view of the imprint apparatus 100 taken along a line A-A in FIG. 1B.

The imprint apparatus 100 is a lithography apparatus that is adopted in a lithography step as a manufacturing step of a semiconductor device or a liquid crystal display element, and performs a process of transferring (forming) a pattern of an original in each of shot regions two-dimensionally arrayed on a substrate. The imprint apparatus 100 performs an imprint process of forming a pattern of an imprint material in a shot region on the substrate using a mold as an original. In this embodiment, the imprint apparatus 100 brings the mold into contact with the imprint material supplied onto the substrate, and applies curing energy to the imprint material, thereby forming a pattern of a cured product to which an uneven pattern of the mold is transferred.

Note that according to the present invention, the lithography apparatus is not limited to the imprint apparatus, and can be applied to an exposure apparatus that adopts die-by-die alignment. The exposure apparatus projects an image of a pattern of a mask as an original onto the substrate via a projection optical system, thereby transferring the pattern of the mask to the substrate.

As the imprint material, a curable composition (to be also referred to as a resin in an uncured state) to be cured by receiving curing energy is used. Examples of the curing energy are an electromagnetic wave, heat, and the like. As the electromagnetic wave, for example, light selected from the wavelength range of 10 nm (inclusive) to 1 mm (inclusive) is used. Examples of the electromagnetic wave are infrared light, a visible light beam, and ultraviolet light.

The curable composition is a composition cured with light irradiation or heating. The photo-curable composition cured by light irradiation contains at least a polymerizable compound and a photopolymerization initiator, and may contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component.

The imprint material may be applied in a film shape onto the substrate by a spin coater or a slit coater. The imprint material may be applied, onto the substrate, in a droplet shape or in an island or film shape formed by connecting a plurality of droplets using a liquid injection head. The viscosity (the viscosity at 25° C.) of the imprint material is, for example, 1 mPa·s (inclusive) to 100 mPa·s (inclusive).

As the substrate, glass, ceramic, a metal, a semiconductor, a resin, or the like is used. A member made of a material different from that of the substrate may be formed on the surface of the substrate, as needed. More specifically, examples of the substrate are a silicon wafer, a semiconductor compound wafer, and silica glass.

A substrate 1 is held by a substrate stage 3 via a chuck 2. The substrate stage 3 is a stage that includes an XY driving unit 4 capable of being driven (moved) in the X and Y directions, a Y driving unit 5 capable of being driven in the Y direction, and a stage base 6 for supporting the XY driving unit 4 and the Y driving unit 5, and moves while holding the substrate 1.

The XY driving unit 4 supports the chuck 2 on its upper surface, and floats by XY bottom air guides 21 using the upper surface of the stage base 6 as a guide surface. In addition, the XY driving unit 4 can be driven in the X direction by XY lateral air guides 24 and an X linear motor movable portion 25 with respect to the Y driving unit 5.

An X scale 30 is arranged in the Y driving unit 5, and an X detection unit 31 is arranged in the XY driving unit 4 to oppose the X scale 30. The X detection unit 31 and the X scale 30 form an X encoder, and measure the X position of the XY driving unit 4 with respect to the Y driving unit 5.

As described above, the Y driving unit 5 forms an X linear motor fixing portion 26 and a guide surface 36 for driving the XY driving unit 4 in the X direction. In addition, the Y driving unit 5 can be driven in the Y direction by Y bottom air guides 22, Y lateral air guides 23, and two Y linear motor movable portions 27 with respect to the stage base 6.

Y linear motor fixing portions 28, a Y scale (R) 32, and a Y scale (L) 34 are arranged in the stage base 6, and a Y detection unit (R) 33 and a Y detection unit (L) 35 are arranged in the Y driving unit 5 to oppose the Y scales 32 and 34, respectively. The Y detection unit 33 and the Y scale 32 form a Y encoder (R), and the Y detection unit 35 and the Y scale 34 form a Y encoder (L). The Y encoder (R) and the Y encoder (L) measure the θ position and the Y position of the Y driving unit 5 with respect to the stage base 6.

The Y position of the Y driving unit 5 with respect to the stage base 6 may be obtained from the measured value of the Y encoder (R) or that of the Y encoder (L), or obtained from an average value of the measured value of the Y encoder (R) and that of the Y encoder (L). Alternatively, the Y position of the Y driving unit 5 with respect to the stage base 6 may be obtained from a ratio between the position of the X encoder and a value obtained by adding the measured value of the Y encoder (R) and that of the Y encoder (L). The θ position of the Y driving unit 5 with respect to the stage base 6 can be obtained by dividing the difference between the measured value of the Y encoder (R) and that of the Y encoder (L) by the distance between the Y encoder (R) and the Y encoder (L). As described above, the X, Y, and θ positions of the XY driving unit 4 with respect to the stage base 6 can be measured in three axis directions by the X encoder, the Y encoder (R), and the Y encoder (L).

A mold 10 is a mold (original) having a pattern (uneven pattern) to be transferred to the substrate 1, and is held by (fixed to) a mold chuck 11. The mold chuck 11 is supported by a mold stage 12. The mold stage 12 is connected to an actuator 15 for vertically moving the mold. By driving the mold stage 12 in the Z direction via the actuator 15, it is possible to bring the mold 10 held by the mold chuck 11 into contact with the imprint material on the substrate, and release the mold 10 from the imprint material on the substrate. Furthermore, the mold stage 12 has a function of correcting the inclination of the mold 10 with respect to the substrate 1 (the surface thereof).

An opening (not shown) that passes light (for example, ultraviolet light) emitted from a light source (not shown) via a collimator lens 13 is formed in each of the mold chuck 11 and the mold stage 12. Load cells (not shown) for detecting a force (a pressing force when pressing the mold 10) when bringing the mold 10 into contact with the imprint material on the substrate are arranged in the mold stage 12. Furthermore, a gap sensor 14 for measuring the height of the substrate 1 held by the substrate stage 3 is arranged in the mold stage 12.

A TTM (Through The Mold) alignment measurement system 16 is arranged in, for example, the mold stage 12. The TTM alignment measurement system 16 includes an imaging system and an optical system for detecting a mark (alignment mark) provided on the mold 10, a reference mark provided on the XY driving unit 4, a mark (alignment mark) provided on the substrate 1, and the like. The TTM alignment measurement system 16 measures the relative positional shift amount in the X and Y directions between the mark provided on the substrate 1 and the mark provided on the mold 10 in a state in which the substrate 1 held by the chuck 2 is close to the mold 10.

A supply unit 17 is formed by a dispenser including a nozzle that drips (discharges) the imprint material (in this embodiment, a photo-curable imprint material) on the substrate, and supplies (applies) the imprint material onto the substrate (a shot region thereof). The supply unit 17 adopts a piezoelectric jet method, micro solenoid method, or the like to supply a droplet of a small volume of the imprint material onto the substrate. It is possible to apply the imprint material onto the substrate by moving the substrate stage 3 while supplying the imprint material from the supply unit 17. The supply unit 17 is arranged at a position away from the mold stage 12 (mold chuck 11) in the X direction.

An off-axis measurement system 18 is supported by a top plate 20, and includes an imaging system and an optical system for detecting the reference mark provided on the XY driving unit 4 and the mark (alignment mark) provided on the substrate 1 without intervention of the mold 10. The off-axis measurement system 18 measures the position of the mark on the XY plane of the substrate 1 with respect to the reference mark provided on the XY driving unit 4.

In the imprint apparatus 100, the TTM alignment measurement system 16 can obtain the positional relationship between the mold 10 and the substrate stage 3, and the off-axis measurement system 18 can obtain the positional relationship between the substrate stage 3 and the substrate 1. Therefore, it is possible to perform relative alignment (positioning) between the mold 10 and the substrate 1 using both the TTM alignment measurement system 16 and the off-axis measurement system 18.

A control unit 19 is formed by a computer including a CPU and a memory, and comprehensively controls the respective units of the imprint apparatus 100 in accordance with a program stored in a storage unit provided in the imprint apparatus 100, for example, a storage unit 19A, thereby operating the imprint apparatus 100. The control unit 19 controls an imprint process for the substrate 1 so that the imprint process is performed by adjusting the positional relationship between the mold 10 and the substrate 1 to reduce the relative positional shift amount between the mark provided on the mold 10 and the mark provided on the substrate 1. At this time, the control unit 19 corrects the target position of the substrate stage 3 so as to reduce the positional shift amount between the mold 10 and the substrate 1, especially, an initial positional shift amount (plunging error) when the substrate stage 3 is moved from a position under the supply unit 17 to a position under the mold 10. The control unit 19 may be configured to communicate with another apparatus in a factory wirelessly or via a cable. The control unit 19 can obtain recipe information by a user interface or communication.

In this embodiment, the control unit 19 controls the imprint process to successively be performed for a plurality of first shot regions included in the first row among the shot regions on the substrate. In addition, the control unit 19 controls the imprint process so that after the imprint process is performed for the plurality of first shot regions, the imprint process is successively performed for a plurality of second shot regions included in the second row adjacent to the first row.

The storage unit 19A includes a storage device such as a RAM, a ROM, and a hard disk drive. The storage unit 19A stores a program, information, and data necessary to operate the imprint apparatus 100, and various measured values of the TTM alignment measurement system 16, the off-axis measurement system 18, the encoders, and the like. In this embodiment, the storage unit 19A stores the positional shift amount (especially, the initial positional shift amount), measured by the TTM alignment measurement system 16, between the mark provided on the mold 10 and the mark provided on the substrate 1 in association with the shot region where the positional shift amount has been measured.

Figure 2:
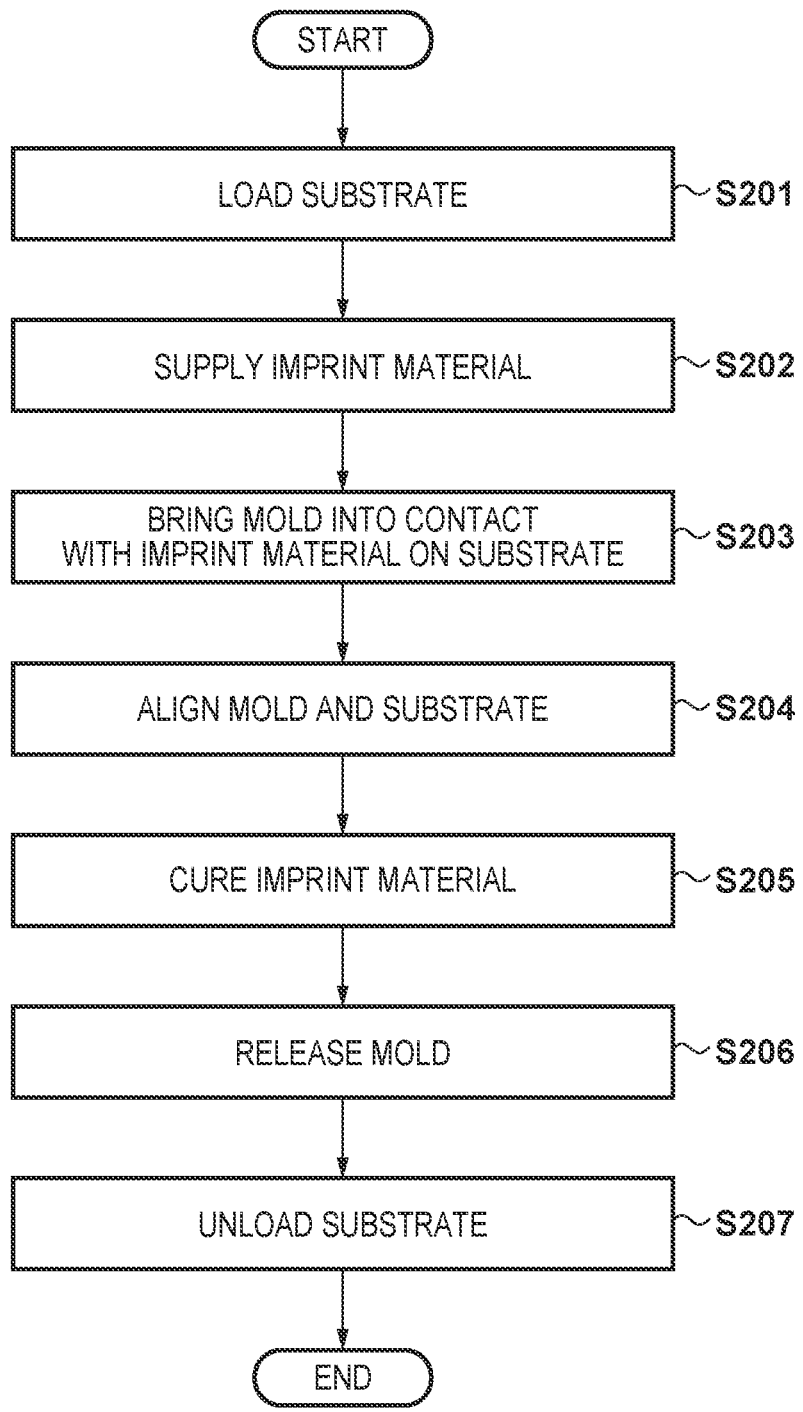
FIG. 2 is a flowchart for explaining an imprint process in the imprint apparatus shown in FIGS. 1A to 1C.

The imprint process in the imprint apparatus 100 will be described with reference to FIG. 2. As described above, the imprint process is performed when the control unit 19 comprehensively controls the respective units of the imprint apparatus 100.

In step S201, the substrate 1 is loaded into the imprint apparatus 100. More specifically, the substrate 1 is loaded into the substrate stage 3 from the outside of the imprint apparatus 100 by a substrate conveyance system (not shown), and is held by the substrate stage 3 by vacuum suction by the chuck 2.

In step S202, the imprint material is supplied onto the substrate. More specifically, the substrate stage 3 is positioned so that the substrate 1 is located under the supply unit 17, and the imprint material is supplied onto the substrate by moving the substrate stage 3 while supplying the imprint material from the supply unit 17.

In step S203, the mold 10 is brought into contact with the imprint material on the substrate. More specifically, the substrate stage 3 is positioned so that the substrate 1 is located under the mold 10, and the mold stage 12 is lowered by the actuator 15, thereby bringing the mold 10 into contact with the imprint material on the substrate. This fills the pattern of the mold 10 with the imprint material on the substrate.

In step S204, the mold 10 and the substrate 1 are aligned (positioned). More specifically, in a state in which the mold 10 is in contact with the imprint material on the substrate, the positional shift amount (initial positional shift amount) between the mark provided on the mold 10 and the mark provided on the substrate 1 is measured using the TTM alignment measurement system 16. Next, based on the positional shift amount measured by the TTM alignment measurement system 16, the substrate stage 3 is moved to align the mold 10 and the substrate 1.

In step S205, the imprint material on the substrate is cured. More specifically, in a state in which the mold 10 and the substrate 1 are aligned, the imprint material on the substrate is irradiated with light from the light source (collimator lens 13) through the mold 10, thereby curing the imprint material. Since the imprint material is cured in the state in which the mold 10 is in contact with the imprint material on the substrate, the pattern of the mold 10 is transferred to the imprint material.

In step S206, the mold 10 is released from the cured imprint material on the substrate. More specifically, the mold 10 is released from the cured imprint material on the substrate by raising the mold stage 12 by the actuator 15. This forms the pattern of the imprint material (the pattern obtained by transferring the pattern of the mold 10) on the substrate.

In step S207, the substrate 1 is unloaded from the imprint apparatus 100. More specifically, the substrate 1 is unloaded from the substrate stage 3 to the outside of the imprint apparatus 100 by the substrate conveyance system.

As described above, the imprint process in the imprint apparatus 100 includes steps S201 to S207. If the initial positional shift amount measured in step S204 is large, it takes a long time to align the mold 10 and the substrate 1. In this embodiment, as described above, the position of the substrate stage 3 (XY driving unit 4) in the three axis directions with respect to the stage base 6 is measured by the three encoders. Therefore, if the positions of the encoders change, the initial positional shift amount between the mark provided on the mold 10 and the mark provided on the substrate 1 when moving the substrate stage 3 with reference to the stage is unwantedly large. The positions of the encoders readily change when, for example, heat generation of three linear motors of the substrate stage 3 becomes large by successively performing the imprint process. Then, the substrate stage 3 is deformed due to heat generation of the linear motors, and the positions of the detection units and the scales forming the encoders change accordingly, causing an error in position measurement (measured value) of the substrate stage 3.

Figure 3A:
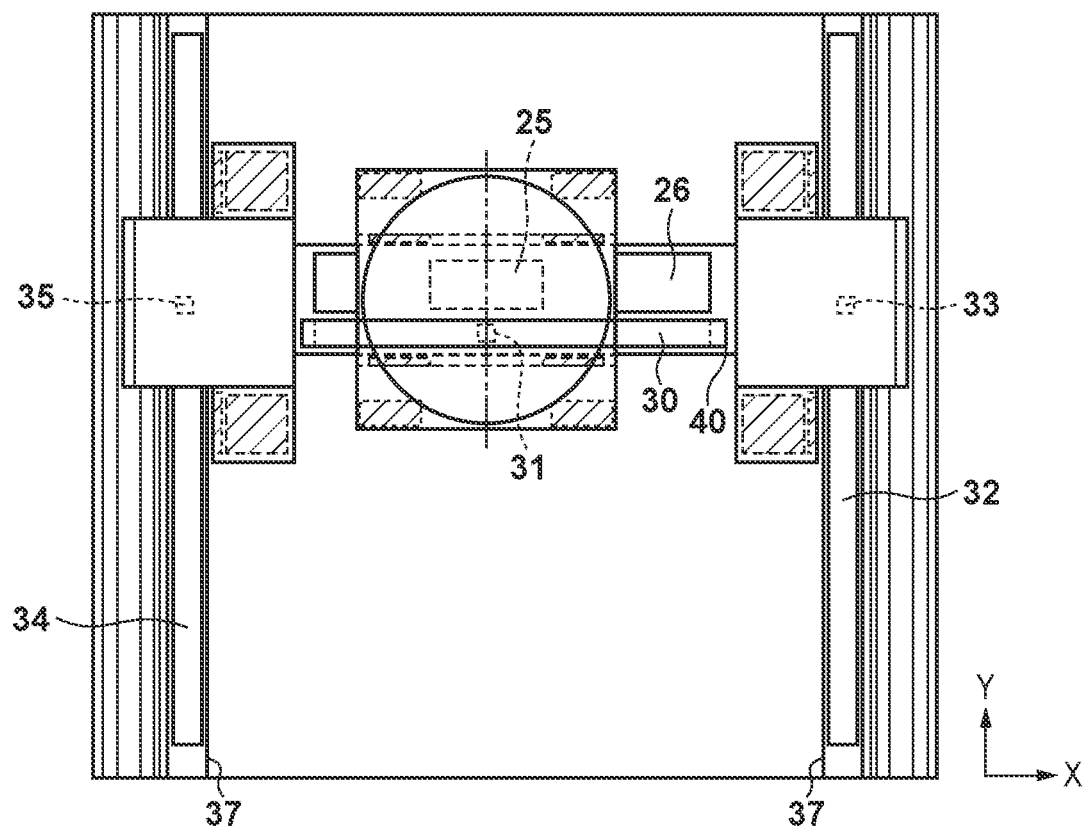
Figure 3B:
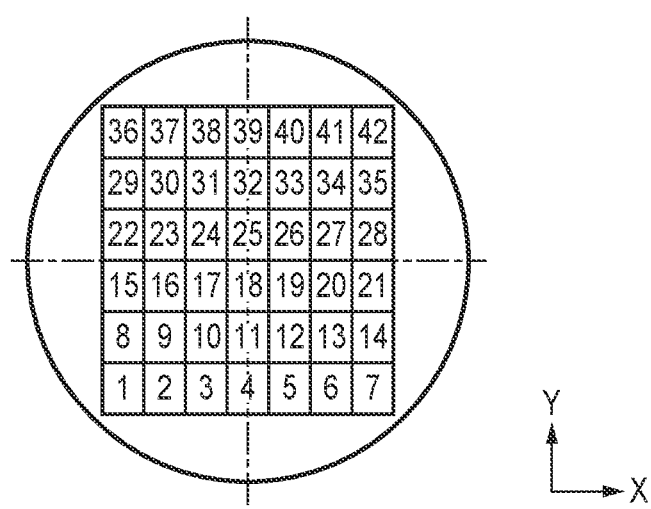

An error occurring in position measurement of the substrate stage 3 when, for example, the X scale 30 extends (is deformed) will be described with reference to FIGS. 3A, 3B, and 3C. FIG. 3A schematically shows a state 40 in which the X scale 30 is deformed to extend due to heat generation of the linear motors and the like. FIG. 3B shows an order of performing the imprint process for the plurality of shot regions on the substrate. This embodiment will describe an example in which a direction in which the process is sequentially performed for the first row (the first to seventh shots) is the same as that in which the process is sequentially performed for the second row (the eighth to 14th shots). The present invention, however, is not limited to this. FIG. 3C shows the initial positional shift amount between the mark provided on the mold 10 and the mark provided on the substrate 1 in each shot region on the substrate.

As shown in FIG. 3A, in the state 40 in which the X scale 30 extends, the X scale 30 extends in the X direction, and thus an error in the X direction unwantedly occurs in position measurement of the substrate stage 3. The error (position measurement error) in the X direction in position measurement of the substrate stage 3 is larger as the X-coordinate (X position) of the substrate stage 3 is farther (larger) from the origin. When, for example, MX represents the extension coefficient of the X scale 30 and L represents the X-coordinate of the substrate stage 3, the position measurement error in the X direction of the substrate stage 3 can be given by MX x L.

As described above, as the X-coordinate L of the substrate stage 3 is larger, the position measurement error in the X direction of the substrate stage 3 is larger. Therefore, as shown in FIG. 3C, the initial positional shift amount gradually becomes larger from the first shot (first shot region) to the seventh shot (seventh shot region). At the eighth shot (eighth shot region), the X-coordinate L of the substrate stage 3 returns to 0. Thus, the initial positional shift amount becomes 0, and the initial positional shift amount gradually becomes larger until the 14th shot (14th shot region).

In this embodiment, even in the state 40 in which the X scale 30 is deformed to extend due to heat generation of the linear motors and the like, the target position of the substrate stage 3 is corrected to reduce the initial positional shift amount between the mark provided on the mold 10 and the mark provided on the substrate 1. For example, when the imprint process is performed for each shot region, the target position of the substrate stage 3 is corrected using the positional shift amount measured by the TTM alignment measurement system 16 (measurement unit) when the imprint process is performed for the preceding shot region.

Note that in this embodiment, when aligning the mold 10 and the substrate 1, the target position of the substrate stage 3 is corrected to move the substrate 1, that is, the substrate stage 3 with respect to the mold 10. Therefore, when aligning the mold 10 and the substrate 1, if the mold 10, that is, the mold stage 12 is moved with respect to the substrate 1, the target position of the mold stage 12 is corrected.

Figure 4A:
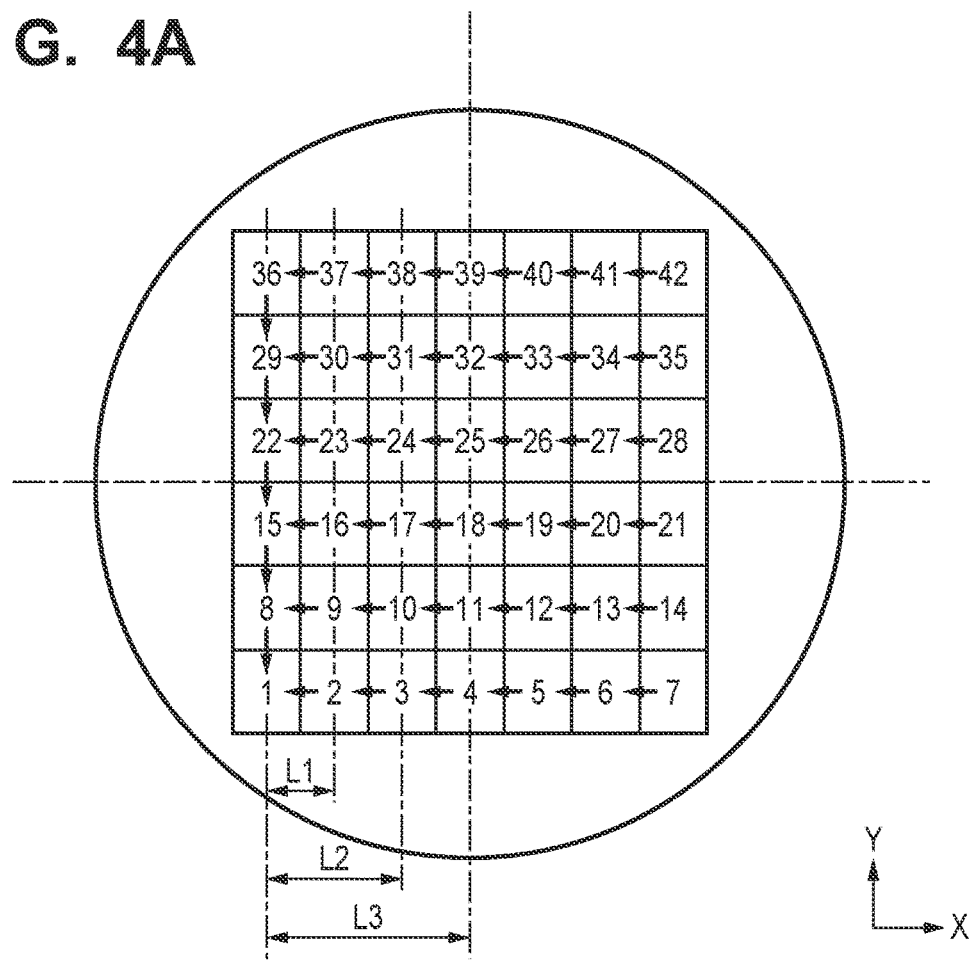
FIGS. 4A and 4B are views for explaining correction of the target position of the substrate stage according to the first embodiment.

Correction of the target position of the substrate stage 3 according to this embodiment will be described with reference to FIGS. 4A and 4B. FIG. 4A shows, by arrows, shot regions to be referred to when correcting the target position of the substrate stage 3 to reduce the initial positional shift amount in each shot region. As shown in FIG. 4A, in this embodiment, when the imprint process is performed at the second shot (second shot region), the first shot (first shot region) as a shot nearest to the second shot is referred to. Similarly, at the third to seventh shots (third to seventh shot regions), the second to sixth shots (second to sixth shot regions) as shots nearest to the third to seventh shots (third to seventh shot regions), respectively, are referred to. When the imprint process is performed at the eighth shot (eighth shot region), the first shot (first shot region) as a shot nearest to the eighth shot is referred to. In other words, with respect to the eighth shot region, the first shot region adjacent to the eighth shot region in a direction orthogonal to that in which the eighth to 14th shot regions are arrayed is referred to.

In this embodiment, a shot region whose distance from each shot region for which the imprint process is performed is shortest is determined as a shot region to be referred to when correcting the target position of the substrate stage 3. The present invention, however, is not limited to this. For example, a shot region whose distance from each shot region for which the imprint process is performed is within a set distance may be determined as a shot region to be referred to when correcting the target position of the substrate stage 3. More specifically, the inter-shot distance between the shot region (for example, the eighth shot region) for which the imprint process is performed and each of the plurality of remaining shot regions (for example, the first to seventh shot regions) is obtained. Based on the inter-shot distance, the shot region whose distance from each shot region for which the imprint process is performed is within the set distance is determined.

In this embodiment, the initial positional shift amount measured in each shot region and the moving amount (correction driving amount) of the substrate stage 3 moved to correct the initial positional shift amount in each shot region are stored in the storage unit 19A in association with the shot region where the initial positional shift amount is measured. The "correction driving amount" indicates the correction amount of the target position of the substrate stage for reducing the initial positional shift amount, as described above. Therefore, the "correction driving amount" does not indicate final alignment described in step S203. Then, when the imprint process is performed for each shot region, the correction driving amount and the initial positional shift amount in the shot region as the nearest shot region of each shot region are added to the target position of the substrate stage 3. This can reduce the initial positional shift amount (the position measurement error in the X direction) in each shot region to MX×L1 (the distance of one shot region in the X direction), as shown in FIG. 4B.

Correction of the target position of the substrate stage 3 according to this embodiment will be described in detail. For example, assume that the initial positional shift amount in the X direction between the mark provided on the mold 10 and the mark provided on the substrate 1 at the first shot, and the correction driving amount at the first shot are 0. In fact, plunging error caused by a factor different from thermal deformation of a structure may occur. If this error remains unchanged with time, a result of transfer using the imprint apparatus may be measured in advance, and an offset amount may be stored as a table for each shot, and corrected. In this embodiment, the initial positional shift amount is set to 0 for the sake of descriptive simplicity but is not limited to 0.

At the second shot, since the initial positional shift amount of the first shot and the correction driving amount of the first shot are 0, the substrate stage 3 shifts by MX×L1 due to the state 40 in which the X scale 30 extends.

At the third shot, since the initial positional shift amount of the second shot is MX×L1 and the correction driving amount of the second shot is 0, MX×L1 is added to the target position of the substrate stage 3 in this embodiment. According to the conventional technique, due to the state 40 in which the X scale 30 extends, the substrate stage 3 shifts by MX×L2 (the distance of two shot regions in the X direction). However, in this embodiment, since MX×L1 is added to the target position of the substrate stage 3, the initial positional shift amount of the third shot is given by MX×L1.

At the fourth shot, since the initial positional shift amount of the third shot is MX×L1 and the correction driving amount of the third shot is MX×L1, MX×L2 (=MX×L1+MX×L1) is added to the target position of the substrate stage 3 in this embodiment. According to the conventional technique, due to the state 40 in which the X scale 30 extends, the substrate stage 3 shifts by MX×L3 (the distance of three shot regions in the X direction). However, in this embodiment, since MX×L2 is added to the target position of the substrate stage 3, the initial positional shift amount of the fourth shot is given by MX×L1.

As described above, in this embodiment, up to the seventh shot, the initial positional shift amount in each shot region can be reduced to MX×L1 by adding, to the target position of the substrate stage 3, the value obtained by adding the initial positional shift amount and the correction driving amount of the shot region as the nearest shot region.

At the eighth shot, since the nearest shot is the first shot, in this embodiment, the initial positional shift amount and the correction driving amount of the first shot are added to the target position of the substrate stage 3. Since the initial positional shift amount of the first shot and the correction driving amount of the first shot are 0, a value added to the target position of the substrate stage 3 is 0. Since, however, deformation in the state 40 in which the X scale 30 extends is also 0, the initial positional shift amount of the eighth shot is 0.

At the ninth or subsequent shot, the initial positional shift amount of the ninth or subsequent shot can be reduced by correcting the target position of the substrate stage 3 at the ninth or subsequent shot using the initial positional shift amount and the correction driving amount of the nearest shot.

Figure 4B:
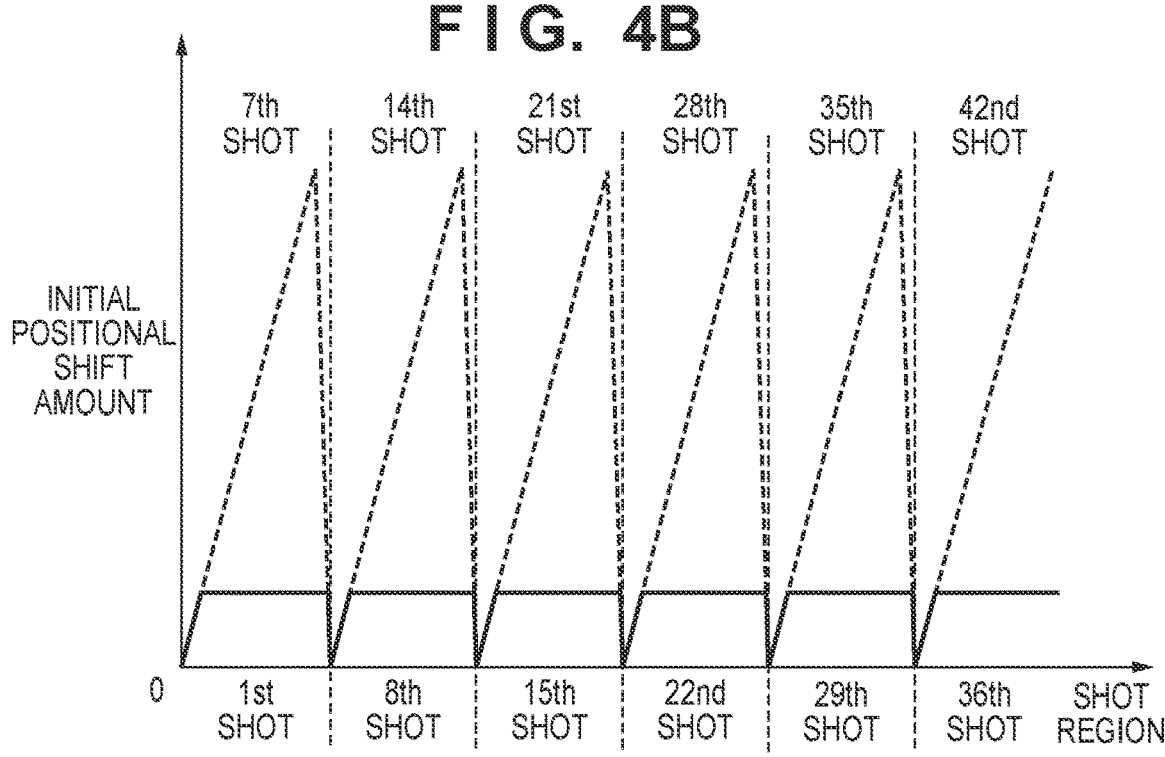

In this embodiment, as shown in FIG. 4B, the initial positional shift amount in each shot region can be reduced. Note that the value obtained by adding the initial positional shift amount and the correction driving amount of the nearest shot is the initial positional shift amount when the above-described correction is not performed at the nearest shot, and will be referred to as a return initial positional shift amount hereinafter. In this embodiment, the initial positional shift amount is reduced by obtaining the return initial positional shift amount from the initial positional shift amount and the correction driving amount of the nearest shot and using the obtained return initial positional shift amount for correction of the target position of the substrate stage 3. This enables the imprint apparatus 100 to improve the speed of the imprint process and improve accuracy of the imprint process at the same time.

This embodiment has exemplified a case in which the target position of the substrate stage 3 is corrected from the initial positional shift amount and the correction driving amount of the nearest shot. However, a case in which the imprint process for the nearest shot does not normally end is also considered. In this case, as described above, the target position of the substrate stage 3 is corrected from the initial positional shift amount and the correction driving amount of the shot region whose distance from each shot region for which the imprint process is performed is within the set distance, for example, the next nearest shot. In other words, the target position of the substrate stage 3 is corrected from the initial positional shift amount and the correction driving amount of the shot region stored in the storage unit 19A as effective data, among the shot regions whose distances from each shot region for which the imprint process is performed are within the set distance. With respect to determination of whether the imprint process is normally performed, for example, a shot region where an error occurs in measurement by the TTM alignment measurement system 16 may be determined as a shot region for which the imprint process is not normally performed. Furthermore, the distance between the shot regions can be obtained based on a shot coordinate position and a shot order stored in the recipe information obtained by the control unit 19.

This embodiment has explained the X encoder. However, as for the Y encoder (R) and the Y encoder (L) as well, the target position of the substrate stage 3 is similarly corrected from the initial positional shift amount and the correction driving amount of the nearest shot, as described above. Even if the Y encoder (R) and the Y encoder (L) are deformed to extend, it is possible to reduce the initial positional shift amount in the Y direction of each shot region by correcting the target position of the substrate stage 3 from the initial positional shift amount and the correction driving amount in the Y direction in the nearest shot. In this embodiment, since the supply unit 17 is arranged at a position away from the mold stage 12 in the X direction, when the imprint process is performed for the plurality of shot regions on one substrate, a moving distance in the X direction is long. This embodiment is advantageous in reducing the influence of a positional shift by the X encoder that largely generates heat due to the reciprocal movement between the supply unit 17 and the mold stage 12.

This embodiment has exemplified a case in which the position of the substrate stage 3 is measured by the encoders. The present invention, however, is not limited to this, and may use any measurement system that performs measurement in one axis direction with respect to the X and Y directions. For example, a linear displacement sensor or laser displacement system may be adopted.

This embodiment has exemplified a case in which each of the X encoder, the Y encoder (R), and the Y encoder (L) performs measurement in one axis direction. A sensor that can perform measurement (length measurement) in two axis directions may be used. If a sensor that can perform measurement in two axis directions is used, for example, not only a change in extension of a scale but also a change in inclination of the scale causes the position measurement error of the substrate stage 3, resulting in an error of the initial positional shift amount. Consider a 2-axis sensor that can perform measurement by setting the X direction as a longitudinal direction and the Y direction as a widthwise direction. The extension of the scale causes a position measurement error in the X direction, and the inclination of the scale causes a position measurement error in the Y direction. In this case as well, it is possible to reduce the initial positional shift amount in the Y direction of each shot region by correcting the target position of the substrate stage 3 from the initial positional shift amount and the correction driving amount in the Y direction of the nearest shot. As a method of performing measurement in the two axis directions, there are provided, for example, a method of performing measurement by an encoder and a method of combining an encoder and a capacitance sensor.

As a method of driving (moving) the substrate stage 3, this embodiment adopts a combination of an air bearing and a linear motor. The present invention, however, is not limited to this. For example, there may be the substrate stage 3 that combines methods of linearly driving in the X and Y directions, and performs measurement in each direction by a sensor that can perform measurement in one axis direction or a sensor that can perform measurement in two axis directions. Furthermore, in this embodiment, the substrate stage 3 is a stage that can move in the two axis directions of the X and Y directions. However, the substrate stage 3 may be a stage that can move in one direction of the X direction or a stage that can move in one or more axis directions by a combination of linear motions.

Second Embodiment

The first embodiment has explained a case in which the change of the position of each encoder (scale and detection unit) caused by heat generation of the linear motors is constant. This embodiment will describe a case in which the position of an encoder gradually changes due to heat generation of a linear motor.

Figure 5:
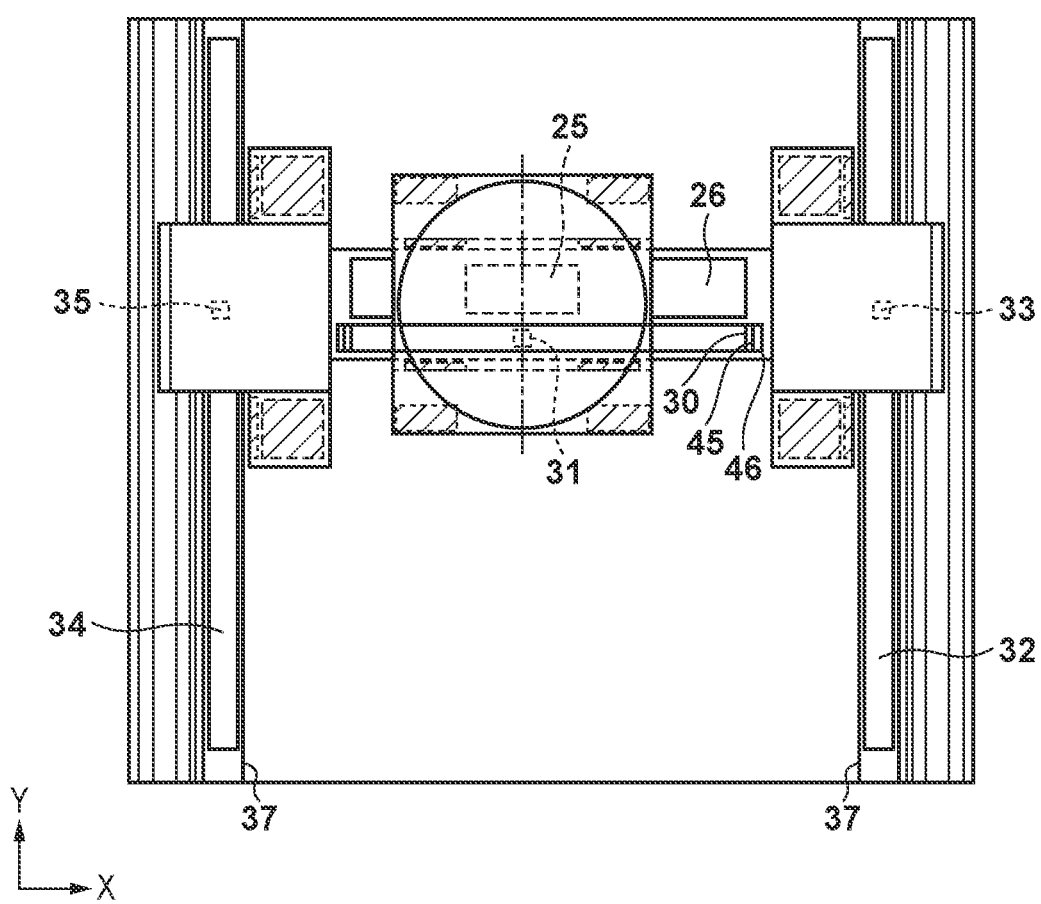
FIG. 5 is a view schematically showing a state in which the X scale is gradually deformed to extend.

FIG. 5 schematically shows a state in which an X scale 30 is gradually deformed to extend due to heat generation of a linear motor and the like. Referring to FIG. 5, "30" also indicates the initial length of the X scale 30. If the imprint process is successively performed for respective shot regions on the first substrate, the X scale 30 is gradually deformed due to heat generation of the linear motor along with driving of a substrate stage 3. Therefore, when starting the imprint process for respective shot regions on the second substrate, a state 45 in which the X scale 30 is deformed to extend is set. Similarly, if the imprint process is successively performed for the respective shot regions on the second substrate, the X scale 30 is further deformed due to heat generation of the linear motor along with driving of the substrate stage 3. Therefore, when starting the imprint process for respective shot regions on the third substrate, a state 46 in which the X scale 30 further extends is set.

Figure 6A:
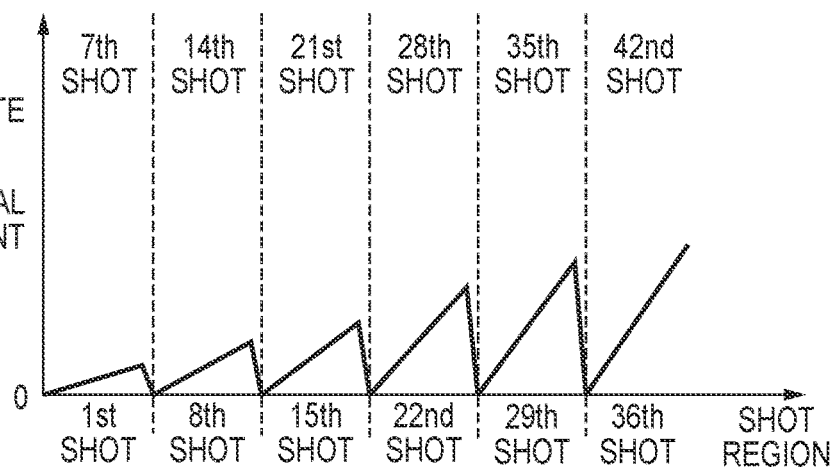
FIGS. 6A to 6C are views each showing an initial positional shift amount in each shot region on each of the first, second, and third substrates.
Figure 6B:
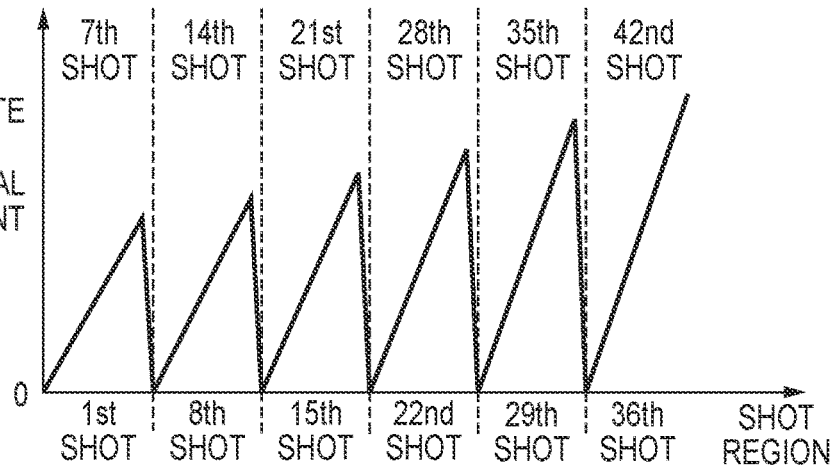
Figure 6C:
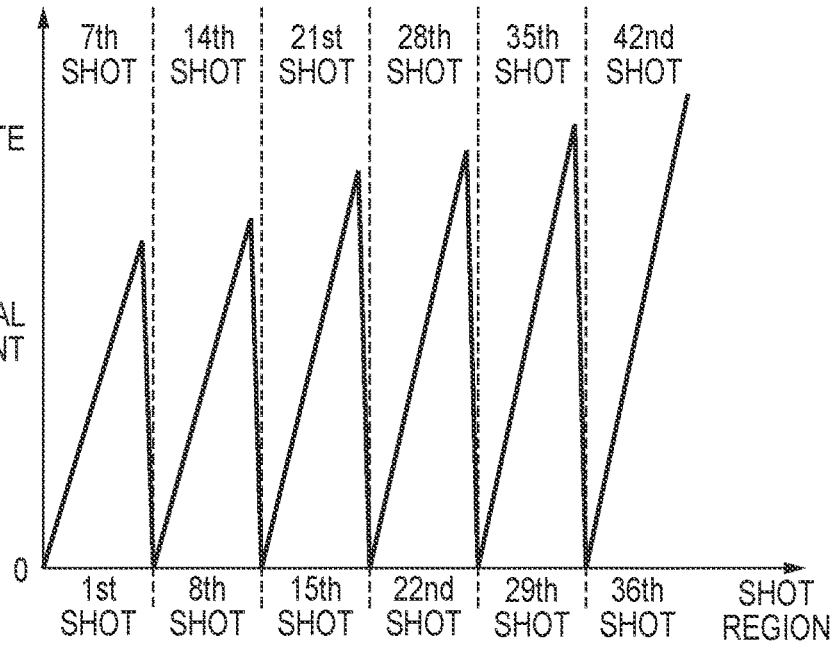

FIGS. 6A, 6B, and 6C are views each showing an initial positional shift amount between a mark provided on a mold 10 and a mark provided on a substrate 1 in each shot region on each of the first, second, and third substrates. Referring to FIG. 6A, since the extension amount of the X scale 30 is small for the first to seventh shots on the first substrate, the initial positional shift amount is also small. However, since the extension amount of the X scale 30 becomes larger as the imprint process for the respective shot regions advances, the initial positional shift amount of the 42nd shot is unwantedly larger than that of the seventh shot. As described above, as the imprint process advances, the initial positional shift amount of each shot region becomes larger.

Referring to FIGS. 6B and 6C, the initial positional shift amount of each shot region on the second substrate and the initial positional shift amount of each shot region on the third substrate similarly become larger as the imprint process advances. The initial positional shift amount of each shot region on the second substrate is larger than that of each shot region on the first substrate. This is caused by the state 45, in which the X scale 30 is deformed to extend, set when starting the imprint process for the respective shot regions on the second substrate. Similarly, the initial positional shift amount of each shot region on the third substrate is larger than that of each shot region on the second substrate. This is caused by the state 46, in which the X scale 30 further extends, set when starting the imprint process for the respective shot regions on the third substrate.

Figure 7A:
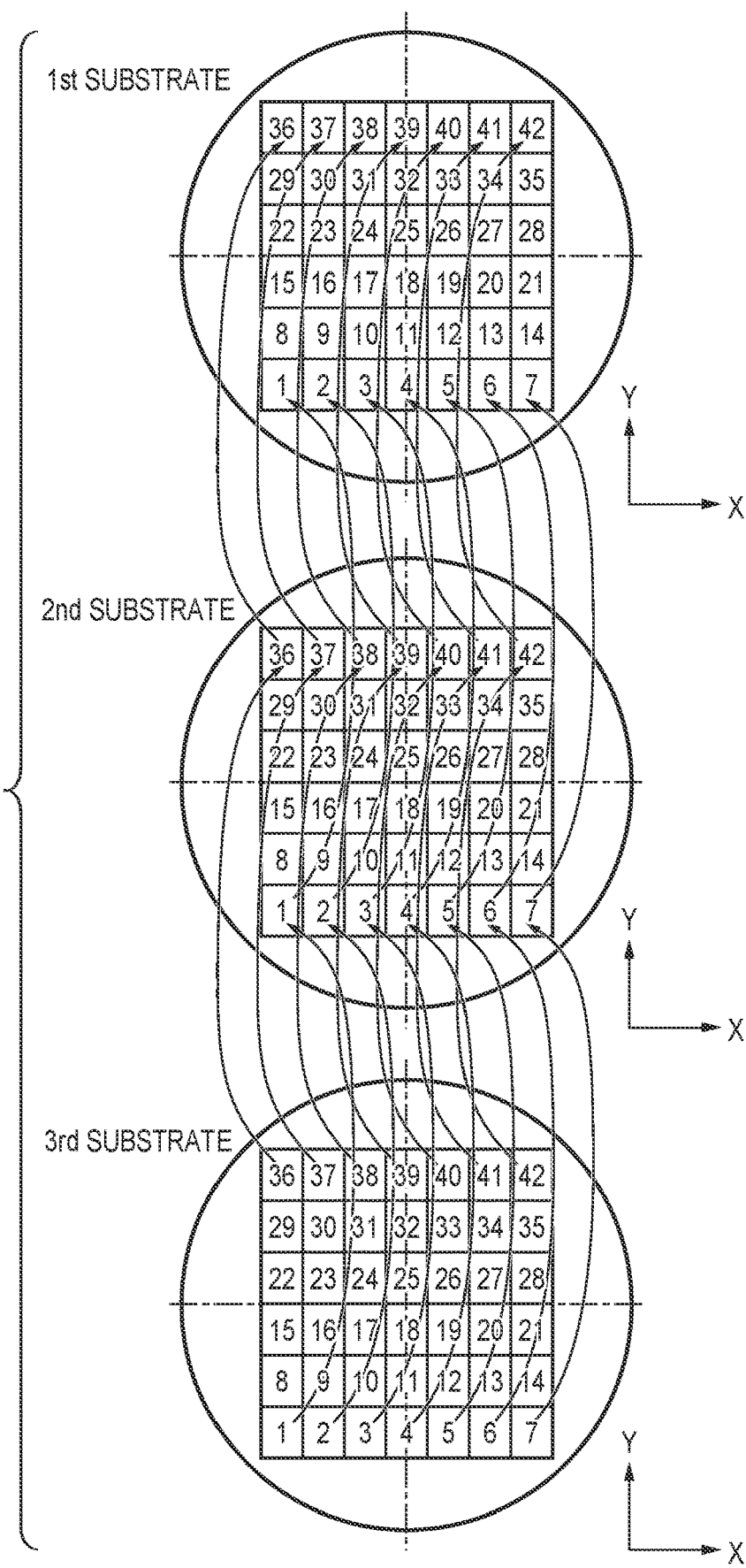
FIGS. 7A to 7D are views for explaining correction of the target position of a substrate stage according to the second embodiment.

Correction of the target position of the substrate stage 3 according to this embodiment will be described with reference to FIGS. 7A, 7B, 7C, and 7D. FIG. 7A shows, by arrows, the shot regions on each of the first and second substrates to be referred to when correcting the target position of the substrate stage 3 to reduce the initial positional shift amount in each shot region on each of the second and third substrates. As shown in FIG. 7A, in this embodiment, when the imprint process is performed for each shot region on the second substrate, each shot region at an identical position (the same shot number) on the first substrate (the immediately preceding substrate) different from the second substrate is referred to. Similarly, when the imprint process is performed for each shot region on the third substrate, each shot region at an identical position on the second substrate different from the third substrate is referred to.

Figure 7B:
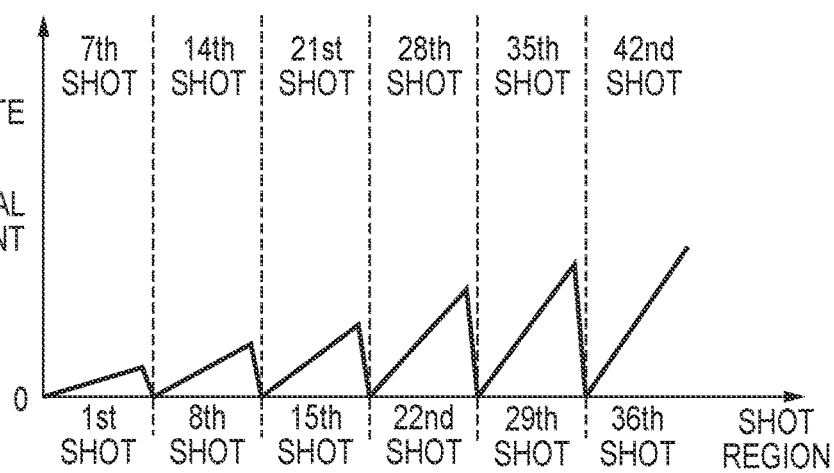
Figure 7C:
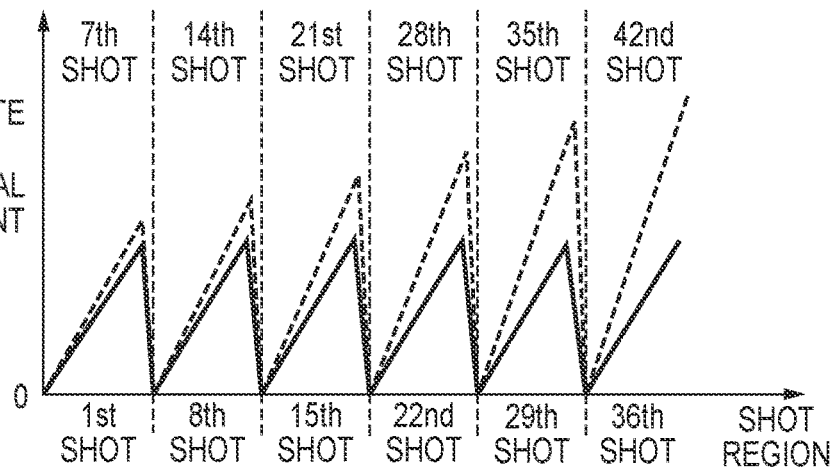
Figure 7D:
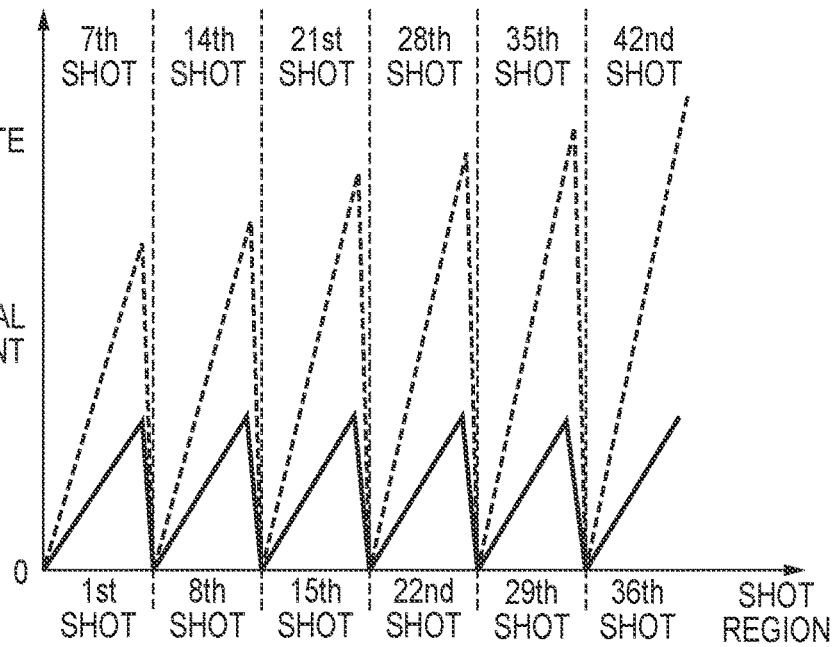

In this embodiment, the initial positional shift amount measured in each shot region of each substrate and the correction driving amount of each shot region of each substrate are stored in a storage unit 19A in association with each shot region of each substrate. Then, when the imprint process is performed for each shot region of each substrate, the initial positional amount and the correction driving amount of each shot region of the immediately preceding substrate are added to the target position of the substrate stage 3. This can reduce the initial positional shift amount (a position measurement error in the X direction) in each shot region on each of the second and third substrates, as shown in FIGS. 7C and 7D.

Correction of the target position of the substrate stage 3 according to this embodiment will be described in detail. In each shot region on the first substrate, the imprint process is performed without correcting the target position of the substrate stage 3. Therefore, as shown in FIG. 7B, the initial positional shift amount of each shot region on the first substrate is equal to that shown in FIG. 6A.

When the imprint process is performed for each shot region on the second substrate, in this embodiment, the initial positional shift amount and the correction driving amount of each shot region at an identical position on the first substrate are added to the target position of the substrate stage 3. For example, at the seventh shot on the second substrate, the initial positional shift amount and the correction driving amount of the seventh shot on the first substrate are added to the target position of the substrate stage 3. This can reduce the initial positional shift amount of the seventh shot on the second substrate to a value obtained by subtracting the correction driving amount of the seventh shot on the first substrate from the initial positional shift amount obtained when the above-described correction is not performed. Similarly, it is possible to reduce the initial positional shift amount of the Nth shot on the second substrate to a value obtained by subtracting the correction driving amount of the Nth shot at an identical position on the first substrate from the initial positional shift amount obtained when the above-described correction is not performed. Therefore, as shown in FIG. 7C, the initial positional shift amount in each shot region on the second substrate is smaller than that (FIG. 6B) obtained when the above-described correction is not performed.

When the imprint process is performed for each shot region on the third substrate, in this embodiment, the initial positional shift amount and the correction driving amount of each shot region at an identical position on the second substrate are added to the target position of the substrate stage 3. For example, at the seventh shot on the third substrate, the initial positional shift amount and the correction driving amount of the seventh shot on the second substrate are added to the target position of the substrate stage 3. The initial positional shift amount of the seventh shot on the second substrate is a value obtained by subtracting the correction driving amount of the seventh shot on the first substrate from the initial positional shift amount obtained when the above-described correction is not performed. Furthermore, the correction driving amount of the seventh shot on the second substrate is the correction driving amount of the seventh shot on the first substrate. Therefore, since the correction driving amount of the seventh shot on the third substrate is a value obtained by adding the initial positional shift amount and the correction driving amount of the seventh shot on the second substrate, the correction driving amount of the seventh shot on the second substrate when the above-described correction is not performed is obtained. This can reduce the initial positional shift amount of the seventh shot on the third substrate to a value obtained by subtracting the correction driving amount of the seventh shot on the second substrate from the initial positional shift amount obtained when the above-described correction is not performed. Similarly, it is possible to reduce the initial positional shift amount of the Nth shot on the third substrate to a value obtained by subtracting the correction driving amount of the Nth shot at an identical position on the second substrate from the initial positional shift amount obtained when the above-described correction is not performed. Therefore, as shown in FIG. 7D, the initial positional shift amount in each shot region on the third substrate is smaller than that (FIG. 6C) obtained when the above-described correction is not performed.

As described above, in this embodiment, when the imprint process is performed for each shot region on the second or subsequent substrate, the target position of the substrate stage 3 is corrected based on the initial positional shift amount and the correction driving amount of each shot region at an identical position on the immediately preceding substrate. This can reduce the initial positional shift amount in each shot region on the second or subsequent substrate, as shown in FIGS. 7C and 7D. Note that a value obtained by adding the initial positional shift amount and the correction driving amount of each shot region on the immediately preceding substrate is the initial positional shift amount obtained when the above-described correction is not performed in each shot region on the immediately preceding substrate, and will be referred to as a return initial positional shift amount hereinafter. In this embodiment, it is possible to reduce the initial positional shift amount by obtaining the return initial positional shift amount from the initial positional shift amount and the correction driving amount of each shot region at an identical position on the immediately preceding substrate and using the obtained return initial positional shift amount for correction of the target position of the substrate stage 3. This enables an imprint apparatus 100 to improve the speed of the imprint process and improve accuracy of the imprint process at the same time.

This embodiment has exemplified a case in which the target position of the substrate stage 3 is corrected from the initial positional shift amount and the correction driving amount of each shot region at an identical position on the immediately preceding substrate. However, a case in which the imprint process for each shot region at an identical position on the immediately preceding substrate does not normally end is also considered. In this case, the target position of the substrate stage 3 is corrected from the initial positional shift amount and the correction driving amount of a near shot region whose distance from the shot region at an identical position on the immediately preceding substrate is within a set distance. In other words, the target position of the substrate stage 3 is corrected from the initial positional shift amount and the correction driving amount of the shot region stored in the storage unit 19A as effective data, among the shot regions whose distances from the shot region at an identical position on the immediately preceding substrate are within the set distance.

In this embodiment, since it is assumed that the X scale 30 uniformly extends (continuously extends) as the imprint process advances, the initial positional shift amount indicates the same trend, as shown in FIGS. 7C and 7D. However, in fact, the extension amount of the X scale 30 gradually decreases with respect to constant heat generation, and is saturated at a given extension amount. This is equivalent to the fact that the extension amount of the X scale 30 depends on the temperature and the temperature of an object for a constant generated heat amount is saturated at a given temperature in terms of a relationship with heat dissipation. If the extension amount of the X scale 30 gradually decreases, the difference in initial positional shift amount from the shot region at an identical position on the immediately preceding substrate becomes smaller every time the imprint process is performed, and thus the initial positional shift amount after correction gradually becomes smaller.

Third Embodiment

This embodiment will describe a case in which the position of an encoder gradually changes due to heat generation of a linear motor, similar to the second embodiment. In this embodiment, to further reduce an initial positional shift amount between a mark provided on a mold 10 and a mark provided on a substrate 1, the first and second embodiments are applied in combination.

Figure 8A:
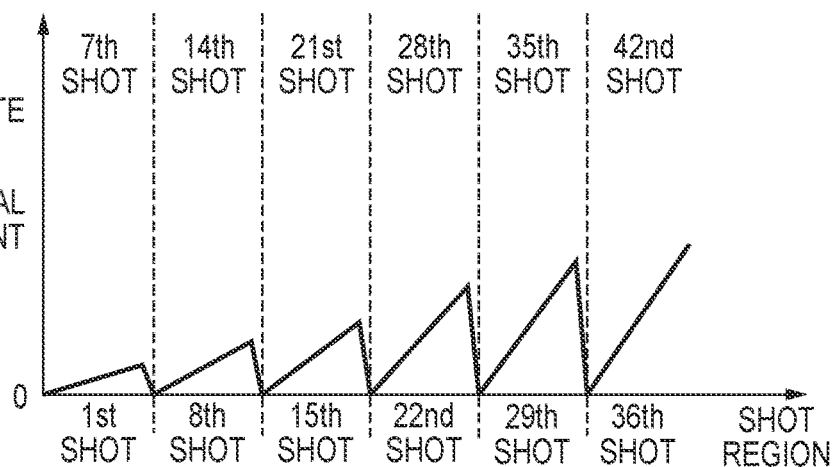
FIGS. 8A to 8I are views for explaining correction of the target position of a substrate stage according to the third embodiment.
Figure 8B:
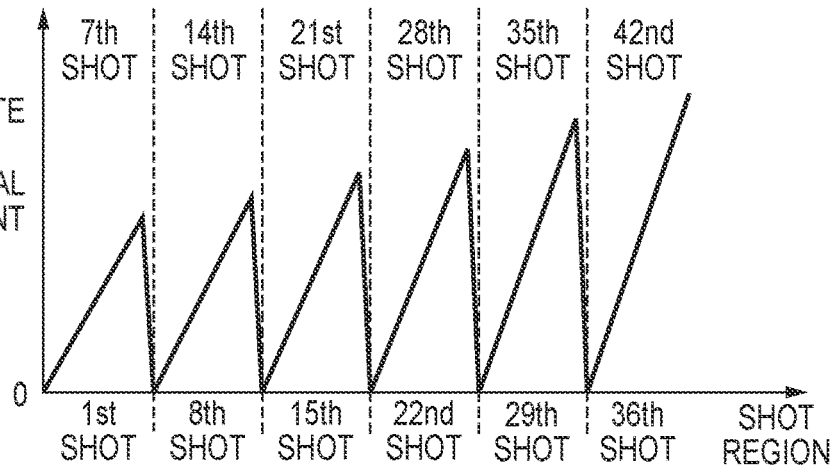
Figure 8C:
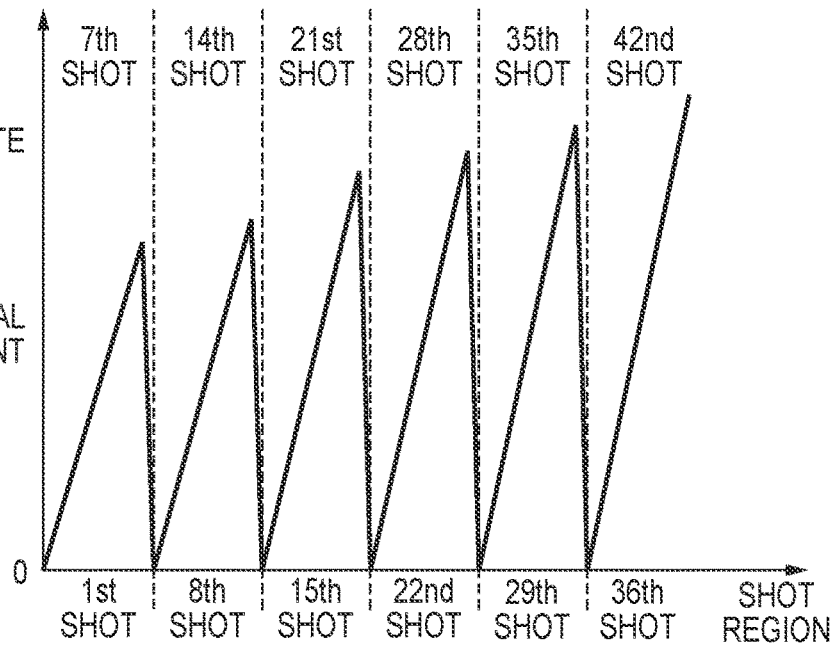
Figure 8D:
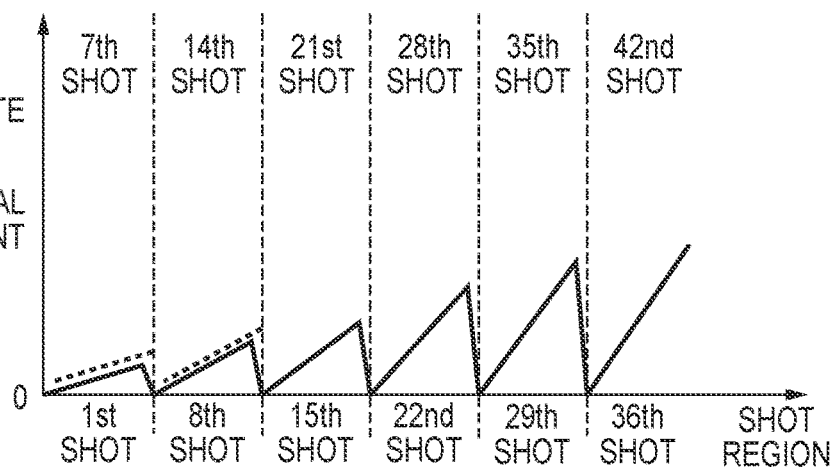
Figure 8E:
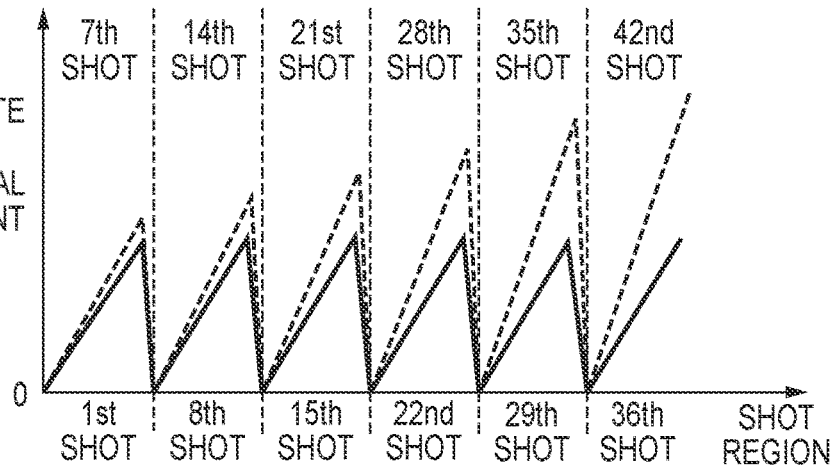
Figure 8F:
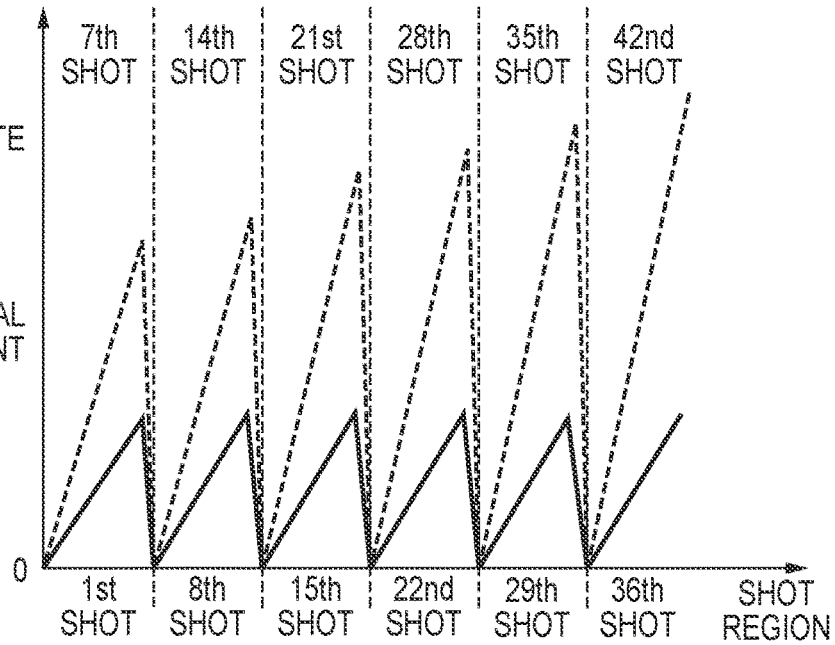
Figure 8G:
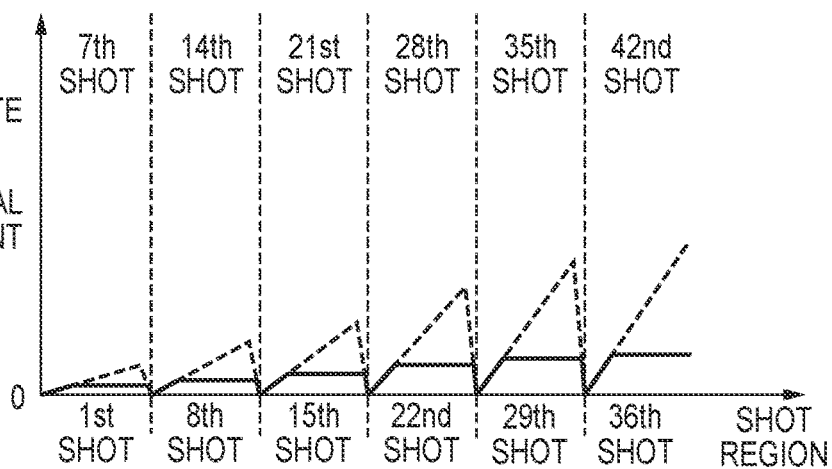
Figure 8H:
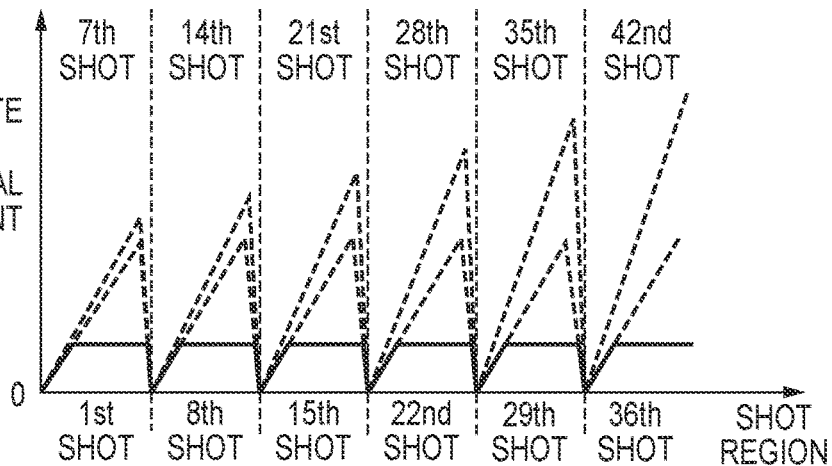
Figure 8I:
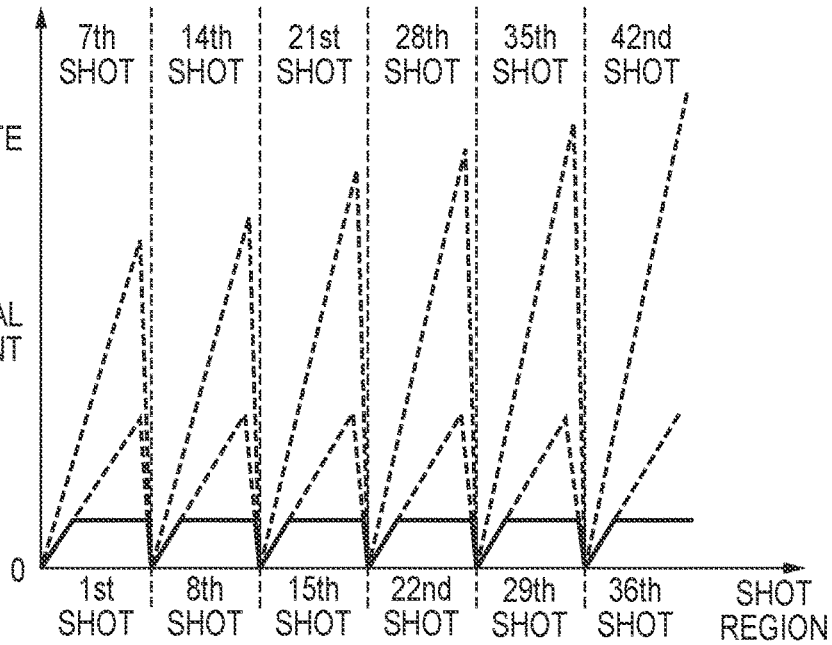

Correction of the target position of a substrate stage 3 according to this embodiment, more specifically, a case in which the first embodiment is applied after the second embodiment is applied will be described with reference to FIGS. 8A to 8I. FIGS. 8A, 8B, and 8C each show the initial positional shift amount of each shot region on each of the first, second, and third substrates when the correction described in the first or second embodiment is not performed (similar to FIGS. 6A, 6B, and 6C). FIGS. 8D, 8E, and 8F each show the initial positional shift amount of each shot region on each of the first, second, and third substrates when the correction described in the second embodiment is performed (similar to FIGS. 7B, 7C, and 7D). FIGS. 8G, 8H, and 8I each show the initial positional shift amount of each shot region on each of the first, second, and third substrates when the correction described in the first embodiment is performed after the correction described in the second embodiment is performed.

In the correction described in the first embodiment, the initial positional shift amount and the correction driving amount of the nearest shot are added to the target position of the substrate stage 3. Therefore, in this embodiment, as shown in FIGS. 8G to 8I, it is possible to reduce the initial positional shift amount in each shot region to the distance of one shot region in the X direction, similar to the first embodiment.

More specifically, at the Mth shot on the Nth substrate, the initial positional shift amount of the nearest shot of the Mth shot on the Nth substrate when the above-described correction is not performed is obtained. The correction driving amount of the nearest shot of the Mth shot on the immediately preceding ((M−1)th) substrate of the Nth substrate and the correction driving amount of the nearest shot of the Mth shot on the Nth substrate are added to the initial positional shift amount after correction of the nearest shot of the Mth shot on the Nth substrate. This gives the initial positional shift amount of the nearest shot of the Mth shot on the Nth substrate (the return initial positional shift amount of the nearest shot of the Mth shot on the Nth substrate). "The correction driving amount of the nearest shot of the Mth shot on the immediately preceding substrate of the Nth substrate" is subtracted from "the return initial positional shift amount of the nearest shot of the Mth shot on the Nth substrate". This can obtain "the initial positional shift amount when the second embodiment is applied to the nearest shot of the Mth shot on the Nth substrate". "The initial positional shift amount when the second embodiment is applied to the nearest shot of the Mth shot on the Nth substrate" is used as "the correction driving amount of the nearest shot of the Mth shot on the Nth substrate".

In addition, "the initial positional shift amount obtained when the second embodiment is applied to the nearest shot of the Mth shot on the Nth substrate" is used as "the correction driving amount of the nearest shot of the Mth shot on the immediately preceding substrate of the (N+1)th substrate". Therefore, "the initial positional shift amount obtained when the second embodiment is applied to the Mth shot on the (N−1)th substrate" is used as "the correction driving amount of the Mth shot on the immediately preceding substrate of the Nth substrate".

"The initial positional shift amount obtained when the second embodiment is applied to the Mth shot on the (N−1)th substrate" is used as the correction driving amount of the Mth shot on the immediately preceding substrate of the Nth substrate. Furthermore, "the initial positional shift amount obtained when the second embodiment is applied to the nearest shot of the Mth shot on the Nth substrate" is used as the correction driving amount of the nearest shot of the Mth shot on the Nth substrate. This makes it possible to apply the second and first embodiments in combination, and to further reduce the initial positional shift amount.

As in this embodiment, if the second and first embodiments are applied in combination, "the return initial positional shift amount of the Mth shot on the Nth substrate" and "the initial positional shift amount obtained when the second embodiment is applied to the Mth shot on the immediately preceding substrate of the Nth substrate" are obtained. Then, "the return initial positional shift amount of the Mth shot on the Nth substrate" and "the initial positional shift amount obtained when the second embodiment is applied to the Mth shot on the immediately preceding substrate of the Nth substrate" need to be stored in the storage unit 19A.

Figure 9:
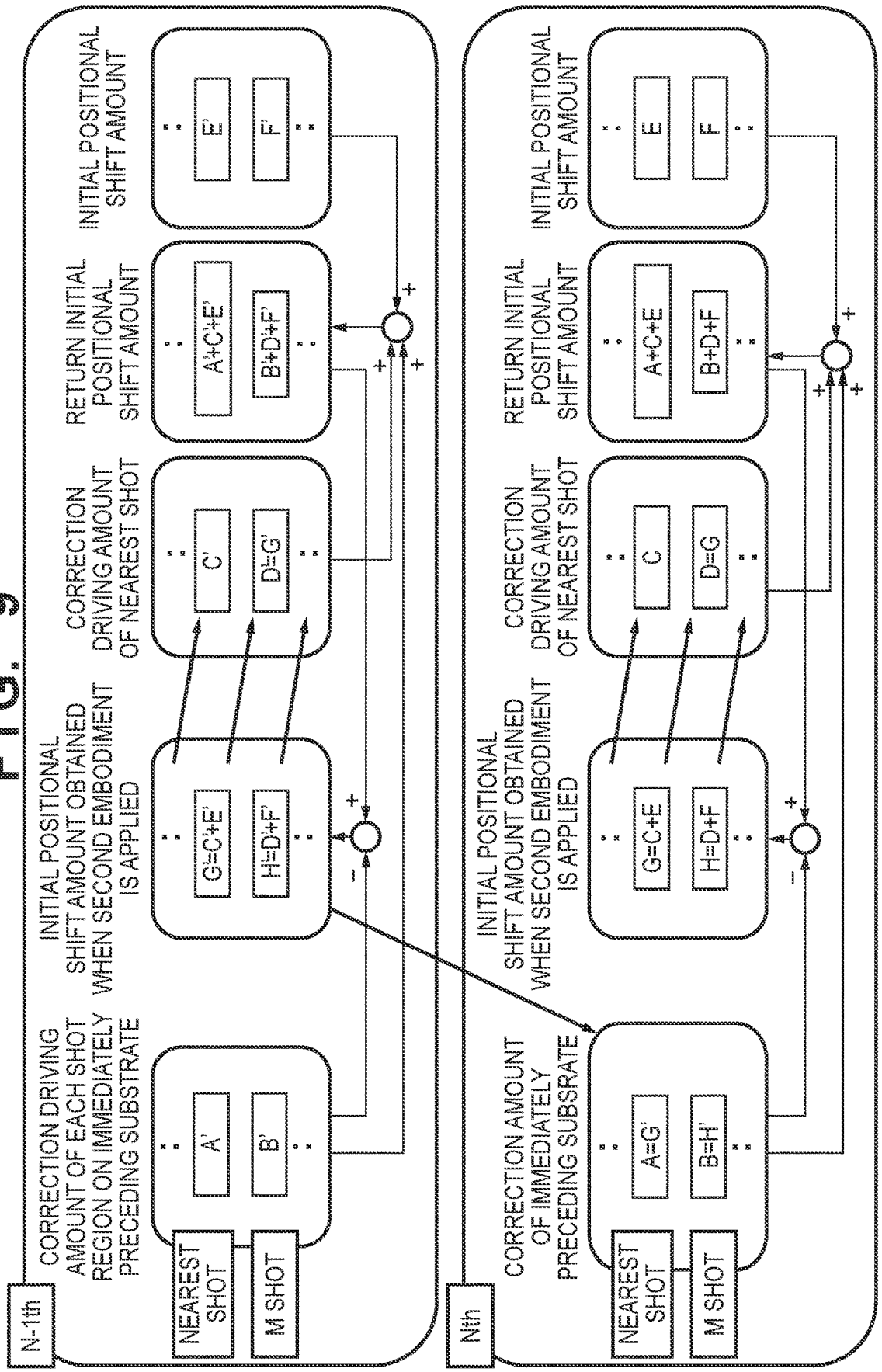
FIG. 9 is a view schematically showing a correction order when the correction described in the first embodiment is performed after the correction described in the second embodiment is performed.

FIG. 9 is a view schematically showing a correction order when the correction described in the first embodiment is performed after the correction described in the second embodiment is performed. The second and first embodiments are applied in combination from "the correction driving amount of each shot region on the immediately preceding substrate", "the initial positional shift amount obtained when the second embodiment is applied", "the correction driving amount of the nearest shot", "the return initial positional shift amount", and "the initial positional shift amount". These values need to be stored as a table in the storage unit 19A.

Figure 10A:
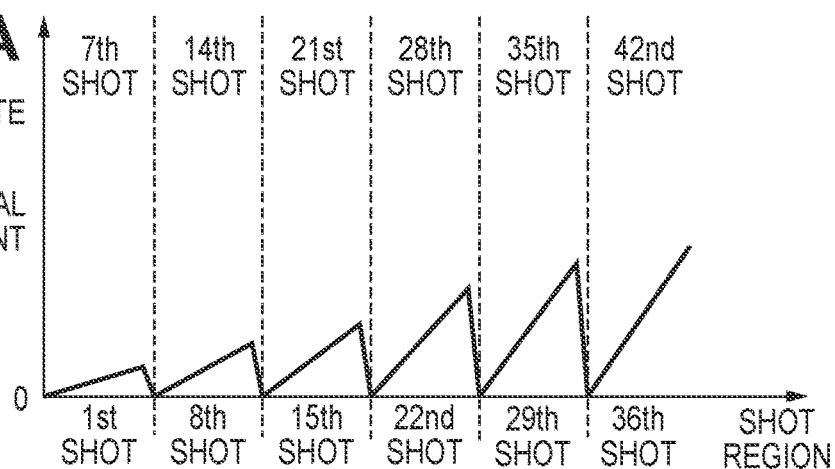
Figure 10B:
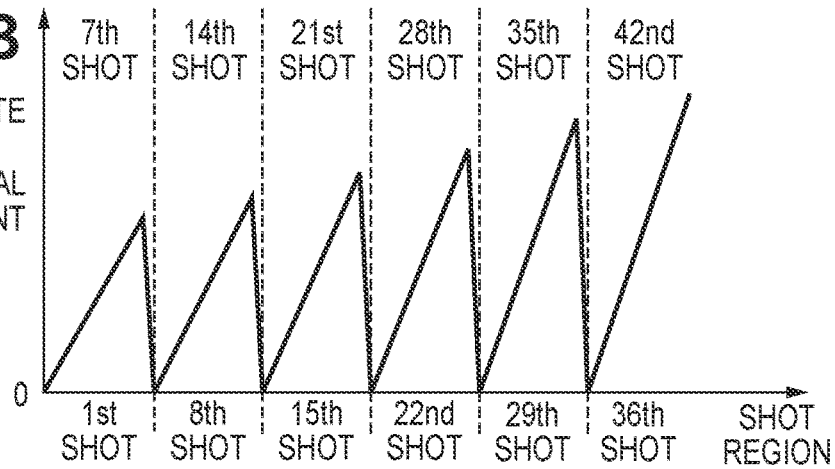
Figure 10C:
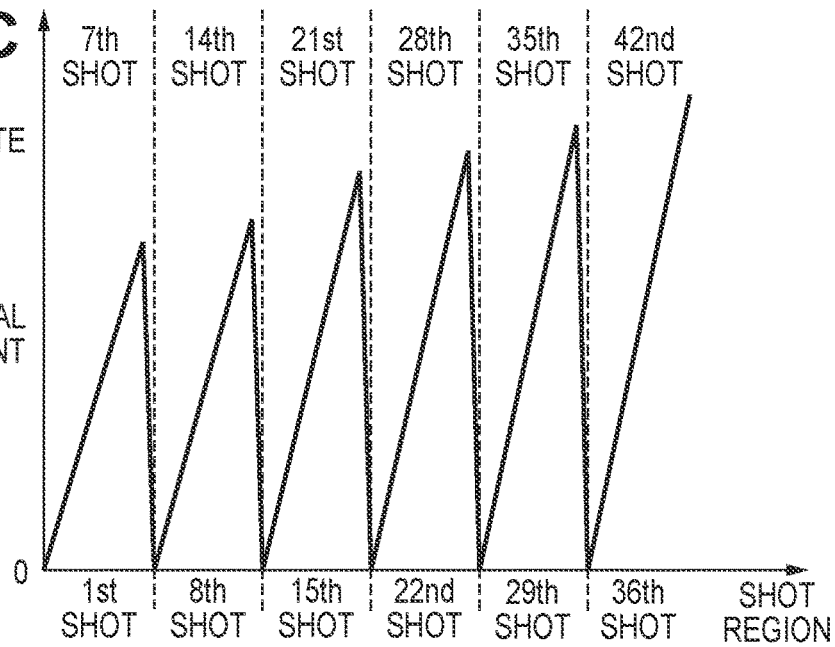

Correction of the target position of the substrate stage 3 according to this embodiment, more specifically, a case in which the second embodiment is applied after the first embodiment is applied will be described with reference to FIGS. 10A to 10I. FIGS. 10A, 10B, and 10C each show the initial positional shift amount of each shot region of each of the first, second, and third substrates when the correction described in the first or second embodiment is not performed (similar to FIGS. 6A, 6B, and 6C). FIGS. 10D, 10E, and 10F each show the initial positional shift amount of each shot region of each of the first, second, and third substrates when the correction described in the first embodiment is performed. In the correction described in the first embodiment, the initial positional shift amount and the correction driving amount of the nearest shot are added to the target position of the substrate stage 3. Therefore, it is possible to reduce the initial positional shift amount in each shot region to the distance of one shot region in the X direction, similar to the first embodiment. FIGS. 10G, 10H, and 10I each show the initial positional shift amount of each shot region of each of the first, second, and third substrates when the correction described in the second embodiment is performed after the correction described in the first embodiment is performed. In the correction described in the second embodiment, the initial positional shift amount and the correction driving amount of each shot region at an identical position on the immediately preceding substrate are added to the target position of the substrate stage 3. Therefore, it is possible to reduce the initial positional shift amount in each shot region to the difference in initial positional shift amount between the substrates, similar to the second embodiment.

More specifically, at the Mth shot on the Nth substrate, the initial positional shift amount of the nearest shot of the Mth shot on the Nth substrate when the above-described correction is not performed is obtained. The correction driving amount of the nearest shot of the Mth shot on the immediately preceding substrate of the Nth substrate and the correction driving amount of the nearest shot of the Mth shot on the Nth substrate are added to the initial positional shift amount after correction of the nearest shot of the Mth shot on the Nth substrate. This gives the initial positional shift amount of the nearest shot of the Mth shot on the Nth substrate when the above-described correction is not performed (the return initial positional shift amount of the nearest shot of the Mth shot on the Nth substrate). "The return initial positional shift amount of the nearest shot of the Mth shot on the Nth substrate" is used as "the correction driving amount of the nearest shot of the Mth shot on the Nth substrate".

"The correction driving amount of the nearest shot of the Mth shot on the Nth substrate" is subtracted from "the return initial positional shift amount of the nearest shot of the Mth shot on the Nth substrate". This can obtain "the initial positional shift amount when the first embodiment is applied to the nearest shot of the Mth shot on the Nth substrate". "The initial positional shift amount when the first embodiment is applied to the nearest shot of the Mth shot on the Nth substrate" is used as "the correction driving amount of the nearest shot of the Mth shot on the (N+1)th substrate". Therefore, "the initial positional shift amount when the first embodiment is applied to the Mth shot on the (N−1)th substrate" is used as "the correction driving amount of the Mth shot on the immediately preceding substrate of the Nth substrate".

"The return initial positional shift amount of the nearest shot of the Mth shot on the Nth substrate" is used as the correction driving amount of the nearest shot of the Mth shot on the Nth substrate. "The initial positional shift amount when the first embodiment is applied to the Mth shot on the (N−1)th substrate" is used as the correction driving amount of the nearest shot of the Mth shot on the immediately preceding substrate. This makes it possible to apply the first and second embodiments in combination, and to further reduce the initial positional shift amount.

FIG. 11 is a view schematically showing a correction order when the correction described in the second embodiment is performed after the correction described in the first embodiment is performed. The first and second embodiments are applied in combination from "the correction driving amount of each shot region on the immediately preceding substrate", "the initial positional shift amount obtained when the first embodiment is applied", "the correction driving amount of the nearest shot", "the return initial positional shift amount", and "the initial positional shift amount". These values need to be stored as a table in the storage unit 19A.

Fourth Embodiment

A pattern of a cured product formed using an imprint apparatus 100 is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

Figure 12A:
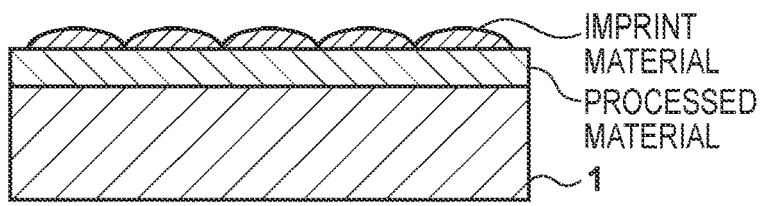
FIGS. 12A to 12F are views for explaining a method of manufacturing an article.

A detailed method of manufacturing an article will be described next. As shown in FIG. 12A, a substrate 1 such as a silicon wafer with a processed material such as an insulator formed on the surface is prepared. Next, an imprint material is applied to the surface of the processed material by an inkjet method or the like. A state in which the imprint material is applied as a plurality of droplets onto the substrate is shown here.

Figure 12B:
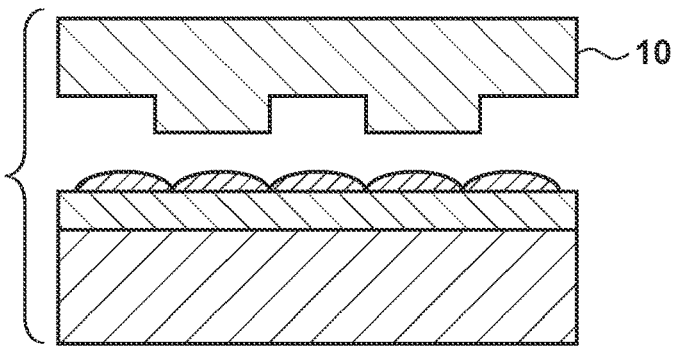
Figure 12C:
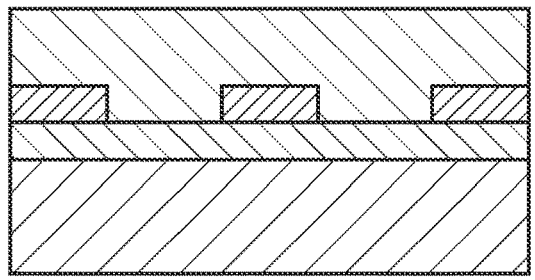

As shown in FIG. 12B, a side of a mold 10 for imprint with an uneven pattern is directed to and caused to face the imprint material on the substrate. As shown in FIG. 12C, the substrate 1 to which the imprint material is applied is brought into contact with the mold 10, and a pressure is applied. The gap between the mold 10 and the processed material is filled with the imprint material. In this state, when the imprint material is irradiated with light serving as curing energy through the mold 10, the imprint material is cured.

Figure 12D:
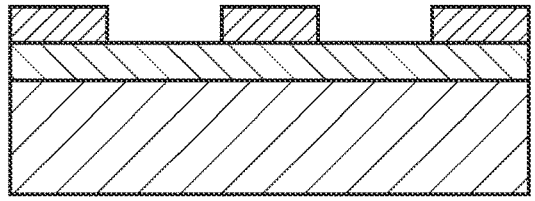

As shown in FIG. 12D, after the imprint material is cured, the mold 10 is separated from the substrate 1. Thus, the pattern of the cured product of the imprint material is formed on the substrate. In the pattern of the cured product, the concave portion of the mold 10 corresponds to the convex portion of the cured product, and the convex portion of the mold 10 corresponds to the concave portion of the cured product. That is, the uneven pattern of the mold 10 is transferred to the imprint material.

Figure 12E:
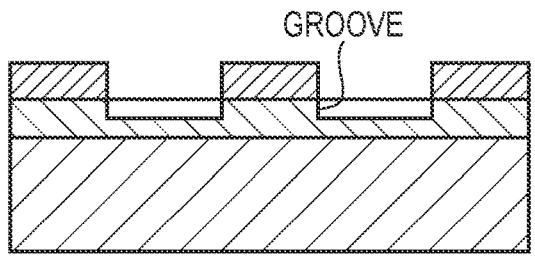
Figure 12F:
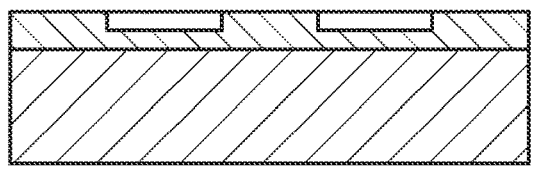

As shown in FIG. 12E, when etching is performed using the pattern of the cured product as an etching resistant mask, a portion of the surface of the processed material where the cured product does not exist or remains thin is removed to form a groove. As shown in FIG. 12F, when the pattern of the cured product is removed, an article with the grooves formed in the surface of the processed material can be obtained. Here, the pattern of the cured product is removed. However, instead of processing or removing the pattern of the cured product, it may be used as, for example, an interlayer dielectric film included in a semiconductor element or the like, that is, a constituent member of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2019-099732 filed on May 28, 2019, which is hereby incorporated by reference herein in its entirety.

What is claimed is:

1. A lithography apparatus for performing a process of transferring a pattern of an original to each of shot regions two-dimensionally arrayed on a substrate, comprising:
   a stage that moves while holding one of the substrate and the original;
   a measurement unit configured to measure, when performing the process, a positional shift amount between a mark provided on the original and a mark provided in each of the shot regions; and
   a control unit configured to control the process for the shot region so that after the process is performed successively for a plurality of first shot regions included in a first row, the process is performed successively for a plurality of second shot regions included in a second row adjacent to the first row,
   wherein when the process is performed for the initial second shot region among the plurality of second shot regions, the control unit corrects a target position of the stage when the process is performed for the initial second shot region, based on the positional shift amount measured by the measurement unit when the process is performed for the first shot region, among the plurality of first shot regions, whose distance from the initial second shot region is within a set distance.

2. The apparatus according to claim 1, wherein the control unit obtains an inter-shot distance between each of the plurality of first shot regions and the initial second shot region, and determines, based on the inter-shot distance, the first shot region whose distance from the initial second shot region is within the set distance.

3. The apparatus according to claim 2, wherein the control unit determines, as the first shot region whose distance from the initial second shot region is within the set distance, the first shot region, among the plurality of first shot regions, whose inter-shot distance is shortest.

4. The apparatus according to claim 1, wherein when the process is performed for the initial second shot region, the control unit corrects the target position of the stage when the process is performed for the initial second shot region, based on the positional shift amount measured by the measurement unit when the process is performed for the first shot region adjacent to the initial second shot region in a direction orthogonal to a direction in which the plurality of second shot regions are arrayed.

5. The apparatus according to claim 1, wherein when the process is performed for the initial second shot region, the control unit corrects the target position of the stage when the process is performed for the initial second shot region, based on a moving amount of the stage moved when the process is performed for the first shot region whose distance from the initial second shot region is within the set distance.

6. The apparatus according to claim 1, wherein
when the process is performed for each of remaining first shot regions obtained by excluding the initial first shot region of the plurality of first shot regions, the control unit corrects the target position of the stage when the process is performed for each of the remaining first shot regions, based on the positional shift amount measured by the measurement unit in the process for a first shot region having undergone the process before the first shot region, and
when the process is performed for each of remaining second shot regions obtained by excluding the initial second shot region among the plurality of second shot regions, the control unit corrects the target position of the stage when the process is performed for each of the remaining second shot regions, based on the positional shift amount measured by the measurement unit in the process for a second shot region having undergone the process before the second shot region.

7. The apparatus according to claim 6, wherein
when the process is performed for each of the remaining first shot regions, the control unit corrects the target position of the stage when the process is performed for each of the remaining first shot regions, based on the positional shift amount measured by the measurement unit in the process for a first shot region adjacent to the first shot region, and
when the process is performed for each of the remaining second shot regions, the control unit corrects the target position of the stage when the process is performed for each of the remaining second shot regions, based on the positional shift amount measured by the measurement unit in the process for a second shot region adjacent to the second shot region.

8. The apparatus according to claim 6, wherein
when the process is performed for each of the plurality of first shot regions, the control unit corrects the target position of the stage when the process is performed for the first shot region, also based on the positional shift amount measured by the measurement unit when the process is performed for a shot region at an identical position to a position of the first shot region, among shot regions two-dimensionally arrayed on a substrate different from the substrate, and
when the process is performed for each of the plurality of second shot regions, the control unit corrects the target position of the stage when the process is performed for the second shot region, also based on the positional shift amount measured by the measurement unit when the process is performed for a shot region at an identical position to a position of the second shot region among the shot regions two-dimensionally arrayed on the substrate different from the substrate.

9. The apparatus according to claim 8, wherein the substrate comprises a substrate to undergo the process subsequently to the different substrate.

10. The apparatus according to claim 1, further comprising a storage unit configured to store, in association with each other, the positional shift amount measured by the measurement unit and the shot region where the positional shift amount has been measured.

11. The apparatus according to claim 1, wherein when a direction in which the process is sequentially performed for the plurality of second shot regions is the same as a direction in which the process is sequentially performed for the plurality of first shot regions, the control unit corrects the target position of the stage when the process is performed for the initial second shot region, based on the positional shift amount measured by the measurement unit when the process is performed for the first shot region, among the plurality of first shot regions, whose distance from the initial second shot region is within the set distance.

12. The apparatus according to claim 1, wherein
the original comprises a mold, and
the process includes an imprint process of forming a pattern of an imprint material in the shot region on the substrate using the mold.

13. A method of manufacturing an article, comprising:
forming a pattern of an original on a substrate using a lithography apparatus that performs a process of transferring the pattern to each of shot regions two-dimensionally arrayed on a substrate, the lithography apparatus comprising:
a stage that moves while holding one of the substrate and the original;
a measurement unit configured to measure, when performing the process, a positional shift amount between a mark provided on the original and a mark provided in each of the shot regions; and
a control unit configured to control the process for the shot region so that after the process is performed successively for a plurality of first shot regions included in a first row, the process is performed successively for a plurality of second shot regions included in a second row adjacent to the first row,
wherein when the process is performed for the initial second shot region among the plurality of second shot regions, the control unit corrects a target position of the stage when the process is performed for the initial second shot region, based on the positional shift amount measured by the measurement unit when the process is performed for the first shot region, among the plurality of first shot regions, whose distance from the initial second shot region is within a set distance;
processing the substrate on which the pattern is formed in the forming; and
manufacturing the article from the processed substrate.

* * * * *